US012655986B2

(12) United States Patent
Kim et al.

(10) Patent No.: US 12,655,986 B2
(45) Date of Patent: Jun. 16, 2026

(54) ELECTRIC RANGE

(71) Applicant: LG ELECTRONICS INC., Seoul (KR)

(72) Inventors: Hyunsoo Kim, Seoul (KR); Junghyeon Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1056 days.

(21) Appl. No.: 17/826,296

(22) Filed: May 27, 2022

(65) Prior Publication Data

US 2022/0381441 A1 Dec. 1, 2022

(30) Foreign Application Priority Data

May 28, 2021 (KR) ........................ 10-2021-0069401
Jun. 22, 2021 (KR) ........................ 10-2021-0081016

(51) Int. Cl.
F24C 15/00 (2006.01)
F24C 15/08 (2006.01)
(Continued)

(52) U.S. Cl.
CPC ............ F24C 15/006 (2013.01); F24C 15/08 (2013.01); H05B 3/68 (2013.01); H05B 6/1263 (2013.01);
(Continued)

(58) Field of Classification Search
CPC ...... F24C 15/006; F24C 15/08; F24C 15/101; H05B 3/68; H05B 6/1263; H05B 2206/022; H05K 7/20145; H05K 7/2039
See application file for complete search history.

(56) References Cited

U.S. PATENT DOCUMENTS

2014/0014649 A1* 1/2014 Chavan ................. F24C 15/101
                                                                        219/620
2017/0347406 A1 11/2017 Cha
(Continued)

FOREIGN PATENT DOCUMENTS

DE         199 35 835         4/2003
EP         2 292 979         3/2011
(Continued)

OTHER PUBLICATIONS

European Search Report issued in Application No. 22176015 dated Oct. 4, 2022.
(Continued)

*Primary Examiner* — Robert G Bachner
(74) *Attorney, Agent, or Firm* — KED & ASSOCIATES

(57) ABSTRACT

An electric range is provided that may include a case, a cover plate coupled to an upper side of the case, and on which an object to be heated is placed, an air blowing fan discharging air, and an air guide that communicates with the air blowing fan, and forms a flow path of air. The air guide comprises a first air guide that communicates with the air blowing fan and guides the air discharged from the air blow fan substantially horizontally, and an expansion protrusion that protrudes from the first air guide in a lengthwise direction of the air guide or in a direction perpendicular to the lengthwise direction of the air guide such that a cross section of the air guide expands.

19 Claims, 18 Drawing Sheets

(51) Int. Cl.
   *H05B 3/68*      (2006.01)
   *H05B 6/12*      (2006.01)
   *H05K 7/20*      (2006.01)

(52) U.S. Cl.
   CPC ....... *H05K 7/20145* (2013.01); *H05K 7/2039* (2013.01); *H05B 2206/022* (2013.01)

(56)         References Cited

U.S. PATENT DOCUMENTS

| | | |
|---|---|---|
| 2020/0154598 A1 | 5/2020 | Kim et al. |
| 2020/0408419 A1 | 12/2020 | Diehl et al. |

FOREIGN PATENT DOCUMENTS

| | | |
|---|---|---|
| EP | 3 503 676 | 6/2019 |
| JP | 3917914 | 5/2007 |
| KR | 10-1307594 | 9/2013 |
| KR | 10-2017-0133937 | 12/2017 |
| KR | 10-2018-0013592 | 2/2018 |
| KR | 10-2020-0053119 | 5/2020 |

OTHER PUBLICATIONS

Korean Office Action dated Jul. 11, 2025 issued in Application No. 10-2021-0081016.

\* cited by examiner

ELECTRIC RANGE

CROSS-REFERENCE TO RELATED APPLICATION(S)

This application claims priority to and benefit of Korean Patent Application Nos. 10-2021-0069401, filed in Korea on May 28, 2021, and 10-2021-0081016, filed in Korea on Jun. 22, 2021, which are hereby incorporated by reference as if fully set forth herein.

BACKGROUND

1. Field

An electric range, and in particular, an electric range having structure capable of effectively cooling an inside of the electric range is disclosed herein.

2. Background

Details in the background section do not constitute prior art but are given only as background information concerning the subject matter of the present disclosure.

Various types of cooking appliances are used to heat food or other items (hereinafter, collectively "food") at homes or restaurants. The cooking appliances include gas ranges using gas and electric ranges using electricity.

The electric ranges are classified as resistance heating-type electric ranges and induction heating-type electric ranges. In terms of electrical resistance heating, electric current is supplied to a metallic resistance wire or a non-metallic heat generating element, such as silicon carbide, to generate heat, and the generated heat is radiated or conducted to heat an object to be heated, for example, a cooking container, such as a pot, or a frying pan, for example.

In terms of induction heating, high-frequency power is supplied to a coil to generate a magnetic field around the coil, and eddy current produced in the generated magnetic field is used to heat an object to be heated made of a metallic material. Regarding basic theories of induction heating, when electric current is supplied to a working coil or a heating coil, heat is generated while an object to be heated is inductively heated, and the object to be heated is heated by the generated heat.

An electric range that operates using the induction heating method is disclosed in KR Patent No. 10-1307594, which is hereby incorporated by reference. A printed circuit board that controls operations of the electric range is mounted onto the electric range. To suppress overheating of the printed circuit board, a heat sink for cooling heat generating elements producing relatively large amounts of heat can be disposed on the printed circuit board.

An air blowing fan is disposed adjacent to the heat sink to cool the heat sink, and an air guide that guides a flow of air discharged from the air blowing fan is provided to cover the heat sink. Additionally, the air guide and the air blowing fan can communicate with each other.

Heat generating elements disposed in an air flow space of the air guide can be effectively cooled by air blown by the air blowing fan. As air flows in the air guide, the air can be heated by heat produced in the heat generating elements. The heated air needs to be discharged from the electric range smoothly through an outlet of the air guide.

If the heated air is partially leaked into the electric range without being discharged from the outlet of the air guide outward along a predetermined flow path, and the leaked air heats components, such as the printed circuit board, for example, disposed in the electric range, adversely affecting performance of the electric range. To prevent this from happening, leakage of the heated air from the outlet of the air guide into the electric range needs to be suppressed, to suppress the heating of the components in the electric range, caused by the heated air.

BRIEF DESCRIPTION OF THE DRAWINGS

Embodiments will be described in detail with reference to the following drawings in which like reference numerals refer to like elements, and wherein:

FIG. 9 is a bottom view showing the air guide according to an embodiment;

FIG. 24 is a perspective cross-sectional view showing a portion of an air guide in an enlarged manner in a state in which a base bracket and a case are coupled.

DETAILED DESCRIPTION

Figure 1:
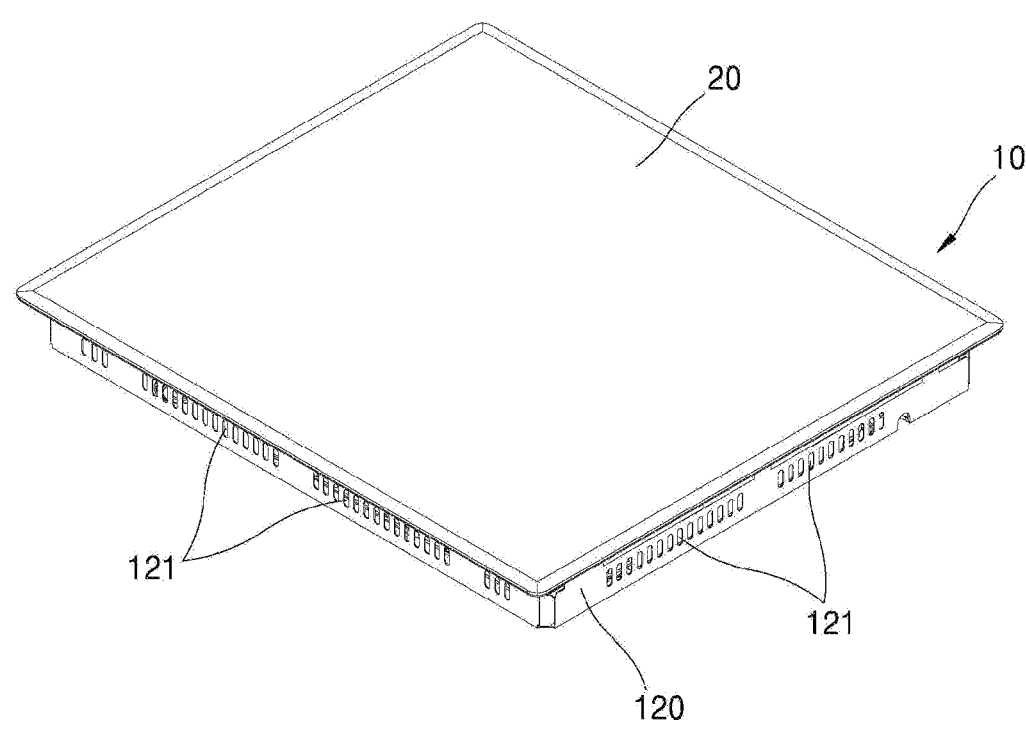
FIG. 1 is a perspective view of an electric range according to an embodiment.

Aspects, features, and advantages are described hereinafter with reference to the accompanying drawings such that one having ordinary skill in the art to which embodiments pertain can embody the embodiments. In this disclosure, descriptions of known technologies in relation to the embodiments are omitted if they could make understanding unnecessarily vague. Hereinafter, embodiments are described with reference to the accompanying drawings. In the drawings, identical reference numerals can denote identical or similar components.

The terms "first" and "second", for example, are used herein only to distinguish one component from another component. Thus, the components should not be limited by the terms. Certainly, a first component can be a second component unless stated to the contrary.

Throughout, each component can be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "include", for example, set forth herein, are not interpreted as necessarily including all the stated components or steps but can be interpreted as excluding some of the stated components or steps or can be interpreted as including additional components or steps.

Throughout, the terms "A and/or B" as used herein can denote A, B or A and B, and the terms "C to D" can denote C or greater and D or less, unless stated to the contrary.

Throughout, an "up-down direction" denotes an up-down direction of an electric range in a state in which the electric range is installed for use. A "left-right direction" denotes a direction orthogonal to the up-down direction, and a "front-rear direction" denotes a direction orthogonal to the up-down direction and the left-right direction. "Both lateral directions" or a "lateral direction" may have the same meaning as the left-right direction or the front-rear direction. These terms can be mixedly used in the disclosure.

Figure 2:
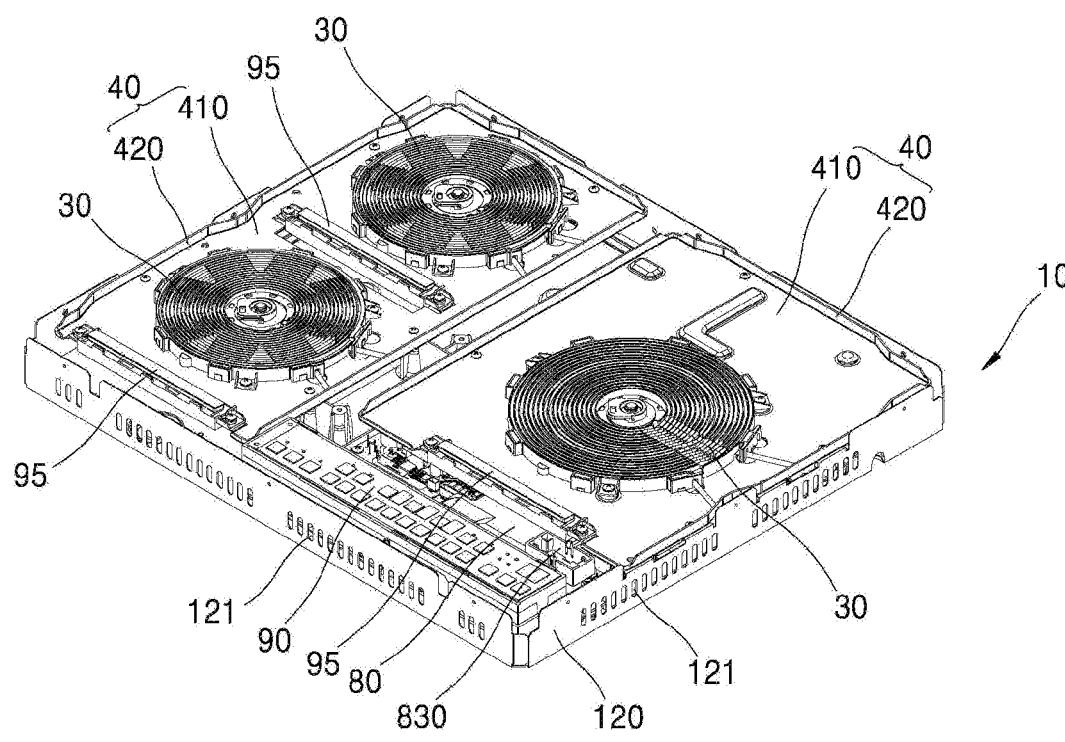
FIG. 2 is a perspective view of the electric range of FIG. 1 without a cover plate.
Figure 3:
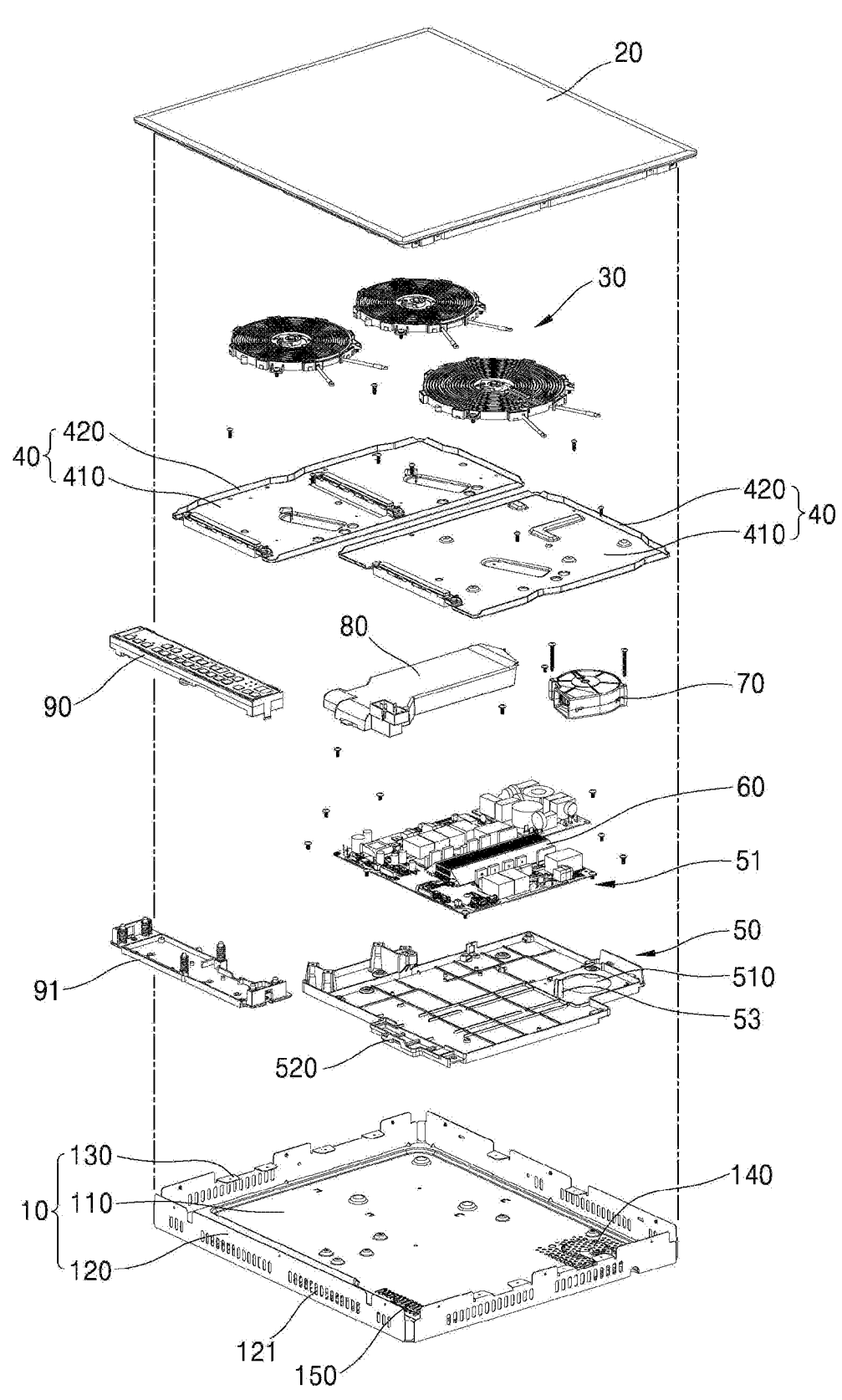
FIG. 3 is an exploded view showing the electric range according to an embodiment.
Figure 4:
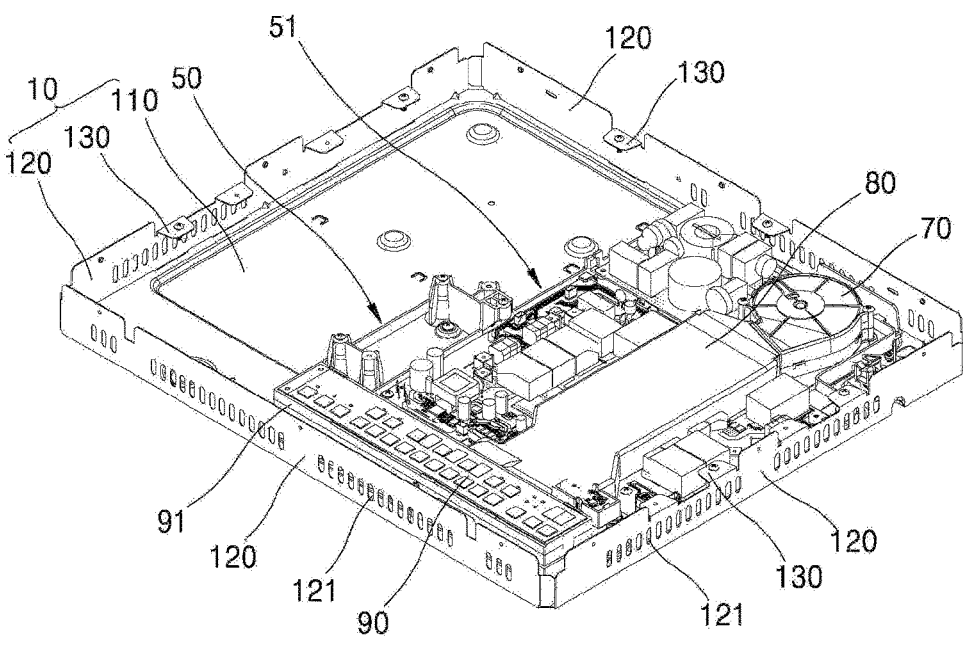
FIG. 4 is a perspective view of the electric range of FIG. 1 without some components.
Figure 5:
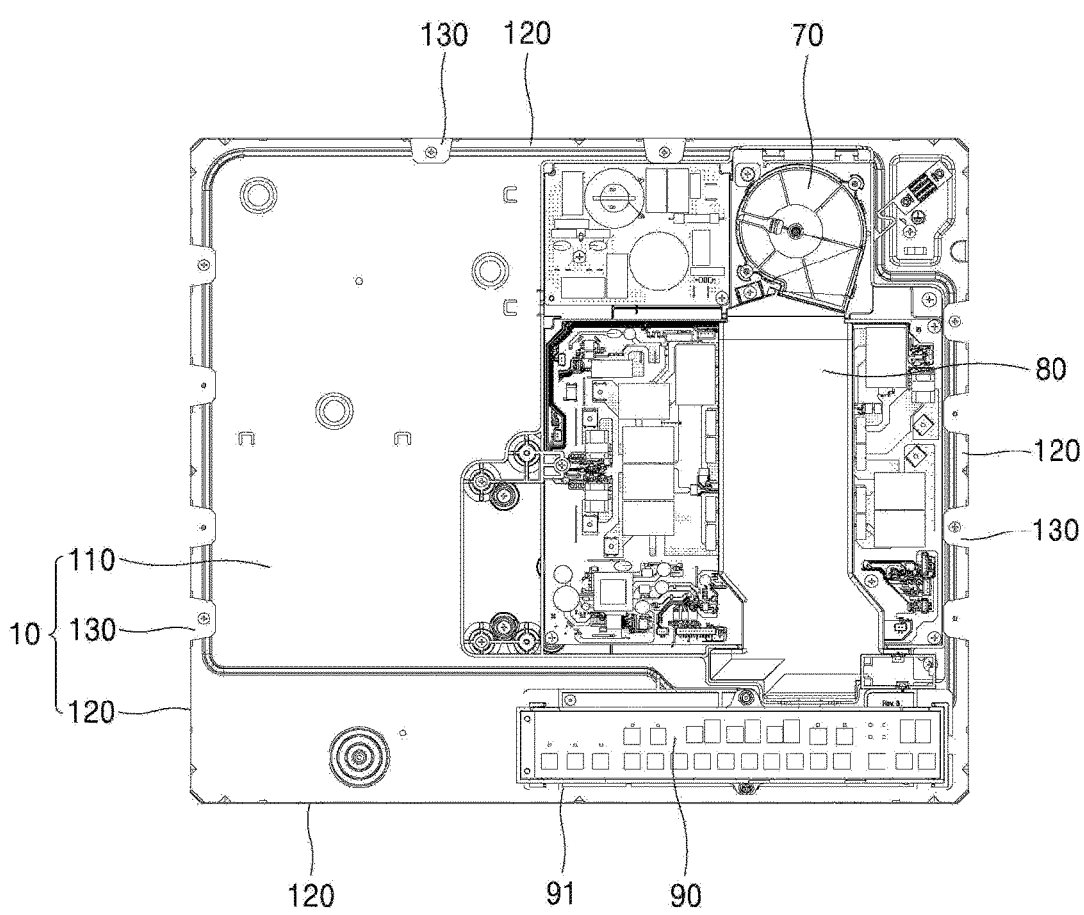
FIG. 5 is a front view of the electric range of FIG. 4.

FIG. 1 is a perspective view of an electric range according to an embodiment. FIG. 2 is a perspective view of the electric range of FIG. 1 without a cover plate 20. FIG. 3 is an exploded view of the electric range according to an embodiment. FIG. 4 is a perspective view of the electric range of FIG. 1 without some components. FIG. 5 is a front view of the electric range of FIG. 4.

The electric range according to an embodiment may inductively heat an object to be heated. In this case, the object to be heated may be, for example, a cooking container containing metal, such as stainless steel, or iron, for example. The induction heating method involves supplying high-frequency power to a working coil to generate a magnetic field around the working coil, and heating an object to be heated made of metal using eddy current produced by the generated magnetic field.

That is, as high-frequency power is supplied to a working coil of a heating part (heater) 30 having a structure in which the working coil is adjacent to a ferrite core, a magnetic field is generated around the working coil, and as a cooking container as an object to be heated is placed in an area of the generated magnetic field, eddy current is induced to the cooking container by the magnetic field, and Joule's heat is generated by the eddy current, thereby heating the cooking container. As the object to be heated is heated, the food contained in the object to be heated is heated and cooked.

The electric range according to an embodiment may include a case 10, a cover plate 20, the heating part 30, an upper bracket 40, and a base bracket 50. The case 10 may protect components constituting the electric range. For example, the case 10 may be made of aluminum; however, embodiments are not limited. Additionally, the case 10 may be thermally insulated to suppress the transfer of heat generated by the working coil of the heating part 30 out of the heating part 30.

The case 10 may accommodate components, such as the heating part 30, a working coil, the upper bracket 40, and a control board 90, for example, that constitute the electric range. An upper portion of the case may be open, and the open portion may be closed by the cover plate 20. The case 10 may be overall formed into a box shape and made up by processing plate-shaped materials, for example.

The case 10 may include a first casing 110, a second casing 120, and a third casing 130. The first casing 110 may form a bottom surface of the case 10. The first casing 110 may support the above-described components built into the electric range.

The first casing 110 may be provided with at least one vent through which air flows, to effectively cool a printed circuit board 51 in the first casing 110 and circuit element components mounted on the printed circuit board 51.

The second casing 120 may be bent from the first casing 110, and form a lateral surface of the case 10. The second casing 120 may be vertically bent from an edge of the first casing 110, and become a lateral wall of the electric range.

The second casing 120 may be disposed on each side of the first casing 110, thereby forming a rectangle. The second casing 120 may improve a rigidity of the entire case 10. That is, the second casing 120 bent from the first casing 110 may suppress deformation of the plate-shaped first casing 110 or damage caused by a weight of the built-in components or an external force.

The second casing 120 may have slits, and further include a plurality of exhaust holes 121. The exhaust holes 121 allow an inside and outside of the case 10 to communicate with each other, such that air flows through the exhaust holes 121 and helps cool the components stored in the case 10.

The third casing 130 may be bent from the second casing 120, and support the upper bracket 40. The third casing 130 may be disposed on each side of the first casing 110.

A first upper plate 410 forming a bottom surface of the upper bracket 40 may be mounted on an upper surface of the third casing 130. The first upper plate 410 and the third casing 130 may be coupled to each other by a coupling member, such as a bolt, for example.

The cover plate 20 may be coupled to the upper end of the case 10, and an object to be heated may be placed on an upper surface of the cover plate 20. The cover plate 20 may close the open upper portion of the case 10 to protect the components stored in the case 10.

An object to be heated is placed on the upper surface of the cover plate 20, and a magnetic field generated in the heating part 30 passes through the cover plate 20 and reaches the object to be heated. The cover plate 20, for example, may be made of a material including ceramics; however, embodiments are not limited thereto.

An input interface configured to receive an input from a user may be disposed on the upper surface of the cover plate 20. The input interface may be installed in a specific area of the upper surface of the cover plate 20 and display a specific image.

The input interface may receive a touch input from the user, and the electric range may operate based on the received touch input. For example, as a module for inputting a heating intensity or heating time, for example, desired by the user, the input interface may be embodied as a physical button or a touch panel, for example. For example, the input interface may be a thin-film-transistor liquid-crystal display (TFT LCD); however, embodiments are not limited thereto.

The control board 90 that inputs an operation instruction to the electric range may be disposed under the cover plate 20. The control board 90 may be provided with a plurality of key switches, and the user may input an instruction to the control board 90 through a key switch to control an operation of the electric range.

The electric range may be provided with a board supporter 91 to stably mount the control board 90 onto the case 10. The board supporter 91 may be disposed in the case 10, and the control board 90 may be mounted onto the board supporter 91.

The board supporter 91 may have a shape configured to be reliably mounted onto the case 10 and mount the control board 90 thereon. The board supporter 91 may be made of plastics, for example, to allow injection molding and may be electrically insulated such that the board supporter is easily manufactured, lightweight, and electrically insulated; however, embodiments are not limited thereto.

The upper surface of the control board 90 may closely contact a lower surface of the cover plate 20. In this case, the control board 90 may be disposed in a position corresponding to the input interface.

The control board 90 and the input interface may connect to each other based on a capacitive touch input. As the user inputs a control instruction to the input interface, the control instruction may be input to the control board 90.

Additionally, a display that displays a drive state of the electric range may be disposed in a specific area of the upper surface of the cover plate 20.

A light display area may be formed on the upper surface of the cover plate 20. A light source unit 95 may be disposed under the cover plate 20, and light irradiated from the light source unit 95 may be delivered to the user through the light display area.

The light display area and the light source unit 95 may be disposed in a mutually corresponding position. When a plurality of light source units 95 is provided, the number of the light display areas disposed on the upper surface of the cover plate 20 may be the same as the number of the light source units.

The electric range may further include a cover bracket that supports the cover plate 20. The cover bracket may support the cover plate 20, on the upper surface of case 10, and be coupled to the second casing 120 of the case 10 by a coupling member, such as a screw bolt, for example.

A plurality of heating parts 30 may be provided, and the plurality of heating parts is disposed under the cover plate 20 and heats the object to be heated. The heating part 30 may be based on induction heating.

Some of the plurality of heating parts 30 may be based on induction heating, and the rest may be embodied as a radiation heating device based on electric resistance heating. Accordingly, the electric range may be embodied as a hybrid range.

Hereinafter, an electric range in which the plurality of heating parts 300 are all based on induction heating is disclosed.

The heating part 30 may be mounted onto the upper bracket 40, and a total of three heating parts may be provided. However, the number of the heating parts 30 is not limited thereto. When a plurality of heating parts 30 is provided, a plurality of upper brackets 40 that supports the heating parts 30 may be provided when necessary.

The heating part 30 is provided with a core frame. A working coil is spirally wound around an upper surface of the core frame, and a ferrite core may be mounted onto a lower surface of the core frame. Accordingly, as high-frequency power is supplied to the working coil, a magnetic field is formed around the ferrite core, and the formed magnetic field may induce eddy current to an object to be heated.

The upper bracket 40 may be disposed under the heating part 30 and support the heating part 30. A plurality of upper brackets 40 may be provided. The upper bracket 40, for example, may be made of aluminum; however, embodiments are not limited thereto.

The upper bracket 40 may be formed into an approximate box shape by, for example, processing plate-shaped metal, to support the heating part 30. The upper bracket 40 may include a first upper plate 410 and a second upper plate 420. The first upper plate 410 may form a bottom surface of the upper bracket 40, and the heating part 30 may be mounted onto the first upper plate 410.

The first upper plate 410 may vertically cover the printed circuit board 51 disposed thereunder. When a plurality of upper brackets 40 is provided, depending on a surface area of the printed circuit board 51, a single first upper plate 410 or a plurality of first upper plates 410 mutually coupled may cover the printed circuit board 51.

With this structure, the first upper plate 410 may block electromagnetic fields and electromagnetic waves that are generated from the heating part 30, from reaching the printed circuit board 51 and elements mounted onto the printed circuit board 51. That is, the upper bracket 40 may improve electromagnetic compatibility (EMC) and electromagnetic interference (EMI) for the printed circuit board 51.

The second upper plate 420 may be bent from the first upper plate 410 in an upward-downward direction of the electric range. The second upper plate 420 may be bent from an edge of the first upper plate 410 vertically.

The second upper plate 420 may be disposed on each side of the first upper plate 410 that is formed overall into a rectangle. When a plurality of the first upper brackets 410 is provided, the second upper plate 420 may be formed on each side of the first upper plate 410 except for a portion that a plurality of the first upper bracket 410 is adjacent to each other.

The second upper plate 420 may improve a rigidity of the entire upper bracket 40. That is, the second upper plate 420 bent from the first upper plate 410 may suppress deformation of the plate-shaped first upper plate 410 or damage caused by a weight of the built-in components including the heating part 30 or an external force.

The light source unit 95 may be disposed on the upper bracket 40. For example, the light source unit 95 may be disposed on the printed circuit board 51 under the upper bracket 40, and the upper bracket 40 may have an opening that is disposed in a position corresponding to the light source unit 95.

The light source unit 95 may be disposed on the upper bracket 40, and electrically connect to the printed circuit board 51 under the light source unit 95. FIGS. 2 and 3 show the electric range having a structure in which the light source unit 95 is disposed on the upper bracket 40.

As described above, a light display area may be formed in a portion of the cover plate 20, which corresponds to the light source unit 95. The light source unit 95, for example, may be provided in such a way that a plurality of LEDs is arranged in a line.

The light source unit 95 may light up as the heating part 30 operates to inform the user whether the heating part 30 operates. Alternatively, the light source unit 95 may change a shape, or color, for example, of the light of the plurality of LEDs to inform the user about an operation state of the electric range.

A number of the light source units 95 may be determined properly depending on a number of the heating parts 30. FIGS. 2 and 3 show three light source units 95 provided for three heating parts 30. However, the number of the light source units 95 is not limited thereto.

The base bracket 50 may be disposed under the upper bracket 40, and the printed circuit board 51 may be mounted onto the base bracket 50. The base bracket 50 may include a bottom plate and a lateral plate. The bottom plate forms the bottom surface of the base bracket 50, and the printed circuit board 51 may be mounted onto the upper surface of the bottom plate.

The lateral plate may be bent from the bottom plate in the upward-downward direction of the electric range. The lateral plate may be formed in such a way that it is bent from an edge of the bottom plate vertically.

The lateral plate may be disposed on each side of the bottom plate entirely formed into a rectangle. When a plurality of upper brackets 40 is provided, the lateral plate may be formed on each side of the bottom plate except for each side of the upper bracket 40 that is adjacent to another side.

The lateral plate may improve a rigidity of the entire base bracket 50. That is, the lateral plate bent from the bottom plate may suppress deformation of the plate-shaped bottom plate or damage caused by a weight of built-in components of the circuit board, for example, or an external force.

The base bracket 50 may be made of, for example, plastics that ensures ease of injection molding and may be electrically insulated such that the base bracket is easily manufactured, lightweight, and electrically insulated; however, embodiments are not limited thereto.

The printed circuit board 51 may be a controller, receive power from an external power source, and communicate with an external device in a wired or wireless manner. The electric range may be equipped with a wireless communication circuit board (WiFi PCB) for wireless communication with an external device, and the printed circuit board 51 may electrically connect to the wireless communication circuit board.

The printed circuit board 51 may be electrically connected to the control board 90 to receive an instruction input by the user from the control board 90. The printed circuit board 51 may be electrically connected to the light source unit 95 and the working coil to control operations thereof.

A heat sink 60 may be mounted on the printed circuit board 51, various types of active elements and passive elements for operating the electric range may be mounted onto the printed circuit board 51, and the printed circuit board 51 may be provided with an electric circuit. The electric range in the embodiment may further include the heat sink 60, an air blowing fan 70, and an air guide 80. An element that generates heat when the electric range operates may be mounted onto the printed circuit board 51.

For example, switching elements in charge of controlling turning-on/off of the heating part 30 generate large amounts of heat, in an electric range. The elements must be cooled to suppress operational error or failure of the electric range, caused by overheating.

The electric range may be provided with the heat sink 60, the air blowing fan 70, and the air guide 80 to cool elements of the printed circuit board 51. Hereinafter, elements that generate large amounts of heat and must be cooled are referred to as "heat generating elements 61".

The heat sink 60 may protect components stored in the case 10 by cooling down the inside of the case 10. The heat sink 60 may be mounted onto the printed circuit board 51 and cool down the printed circuit board 51. Additionally, the heat sink 60 may reduce a temperature of heat generated by electromagnetic interaction as the heating part 30 operates.

For example, the heat sink 60 may include a plurality of cooling fins 610, and the air guide 80 may be provided to cover the plurality of cooling fins 610, thereby guiding air to the plurality of cooling fins 610. The heat sink 60 and the plurality of cooling fins 610 are specifically described with reference to the following drawings.

The air blowing fan 70 may be mounted onto the base bracket 50 and discharge air toward the heat sink 60. The air blowing fan 70 may be electrically connected to the printed circuit board 51, and an operation thereof may be controlled by the controller embodied as the printed circuit board.

Referring to FIG. 5, for air, blown by the air blowing fan 70, to flow to the heat sink 60, a guide wall may be formed at an outlet of the air blowing fan 70, through which air is discharged. The guide wall may guide air in a direction in which the heat sink 60 is disposed. As the air blowing fan 70 operates, air in the case 10 is blown to the heat sink 60, and the heat sink 60 may cool the printed circuit board 51 and the inside of the case 10.

Figure 6:
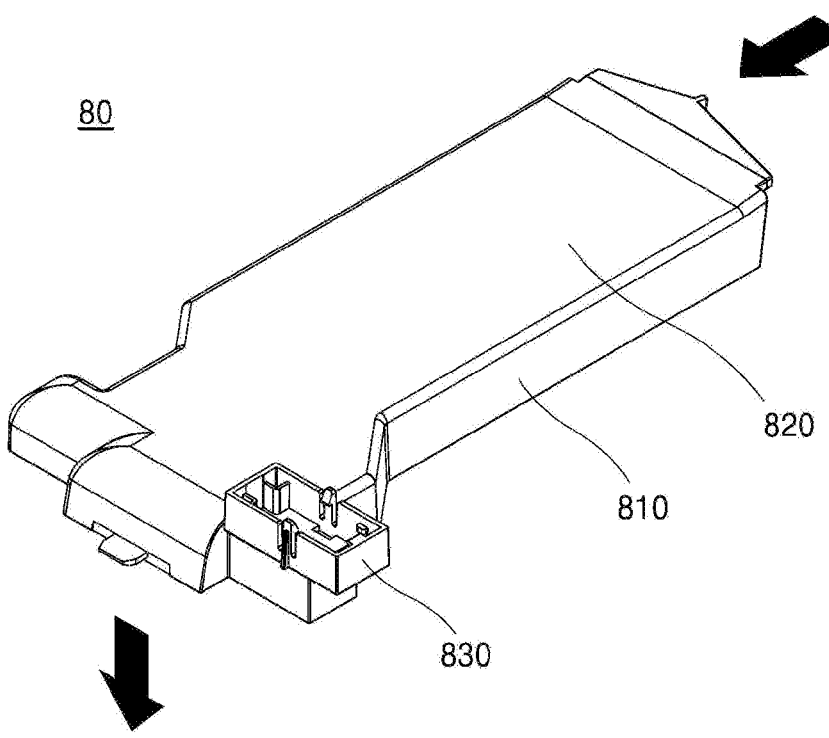
FIG. 6 is a perspective view showing an air guide according to an embodiment.
Figure 7:
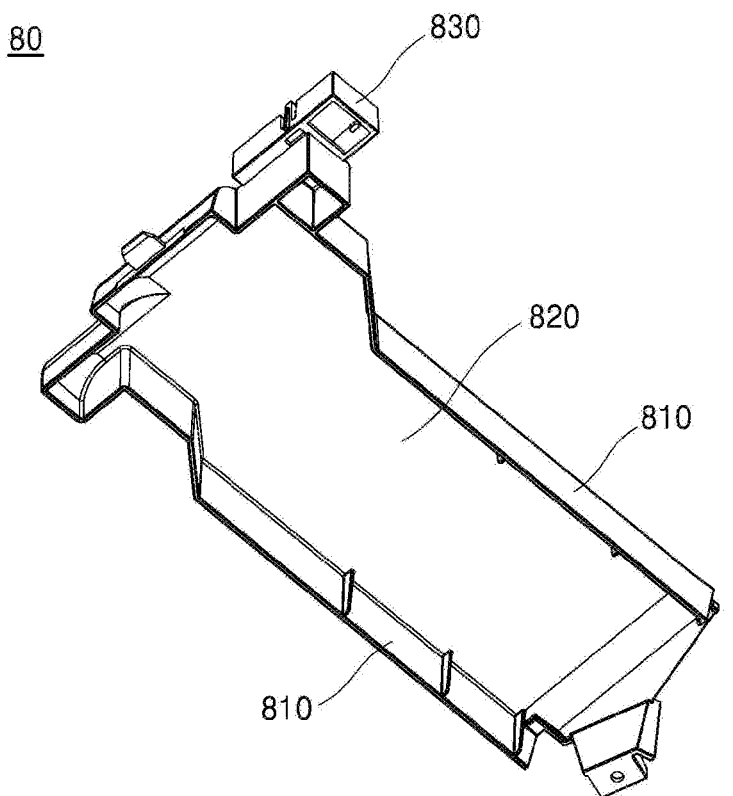
FIG. 7 is a perspective view of the air guide of FIG. 6 viewed from a different direction.
Figure 8:
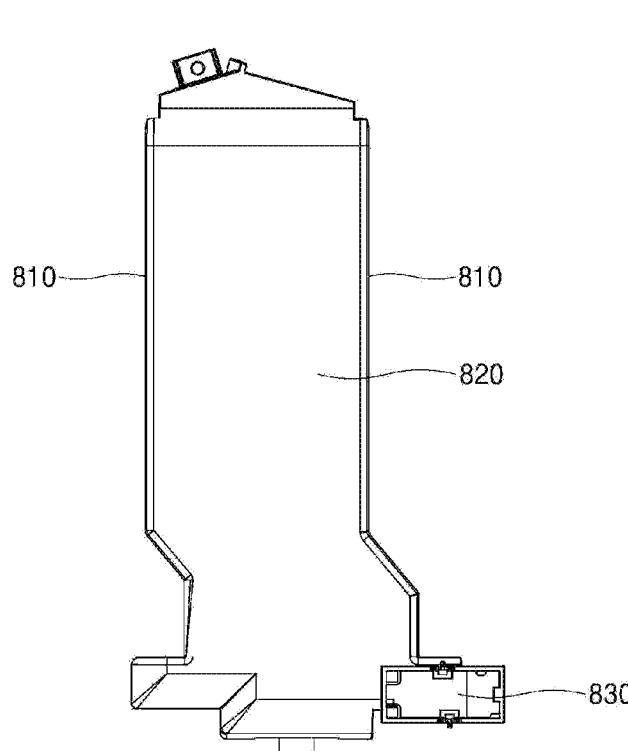
FIG. 8 is a plan view of the air guide according to an embodiment.
Figure 9:
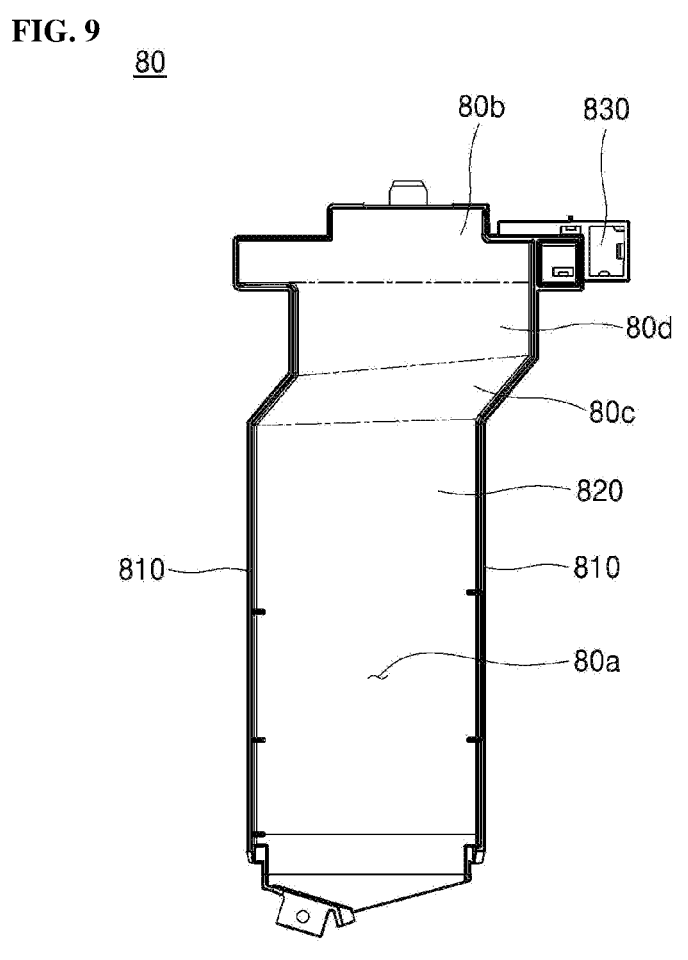

FIG. 6 is a perspective view of an air guide 80 according to an embodiment. FIG. 7 is a perspective view of the air guide FIG. 6 viewed from a different direction. FIG. 8 is a plan view of the air guide according to an embodiment. FIG. 9 is a bottom view of the air guide according to an embodiment.

The air guide 80 may communicate with the air blowing fan 70, surround the heat sink 60, and form a flow path of air that cools the heat sink 60. The air guide 80, for example, may be made of plastics that ensures easy of injection molding and electrical insulation; however, embodiments are not limited thereto.

The arrows in FIG. 6 indicate directions in which air flows. Referring to FIG. 6, the air guide 80 may change the direction in which air flows. That is, the air guide 80 is formed so that air may flow in a frontward-rearward direction of the electric range at an inlet of the air guide 80 while air may flow in the upward-downward direction of the electric range at an outlet of the air guide 80.

With this structure, air discharged from the air blowing fan 70 may flow into the air guide 80 in the frontward-rearward direction of the electric range, and escape out of the air guide 80 in a downward direction of the electric range. Further, the air guide 80 may be detachably coupled to the base bracket 50. For example, a rear of the air guide 80 adjacent to the air blowing fan 70, may be coupled to the base bracket 50 by a coupling tool, such as a screw bolt, for example. Additionally, for example, a front of the air guide 80, through which air is discharged, may be shape-fitted to the base bracket 50.

The air guide 80 may include a first lateral wall 810 and a second lateral wall. A flow space in which air flows may be formed by the first lateral wall 810 and the second lateral wall.

A pair of first lateral walls 810 may be provided, and the pair of first lateral wall 810 may be respectively disposed on both sides of the heat sink 60. An upper wall 820 may be coupled to an upper end of the pair of first lateral walls 810 to cover the heat sink 60.

The space formed by the first lateral wall 810 and the second lateral wall may be a flow space in which air flows.

The heat sink 60 may be disposed in the flow space, and the heat sink 60 may be cooled by air flowing in the flow space of the air guide 80.

The air guide 80 may be provided with a communication substrate mounting part (mount) 830. The communication substrate mounting part 830 may be disposed in a portion that protrudes from an end portion of the upper bracket 40 laterally, in a state in which the air guide 80 is mounted onto the electric range.

With this structure, a wireless communication circuit board mounted onto the communication substrate mounting part 830 is disposed not to vertically overlap the upper bracket 40 made of metal. Accordingly, the wireless communication circuit board may smoothly communicate with an external device, without being interfered with by jamming of the upper bracket 40 made of metal.

Referring to FIG. 9, the air guide 80 may include a first air guide portion (guide) 80a that communicates with the air blowing fan 70. The first air guide portion 80a may guide air such that the air flows in a lateral direction of the base bracket 50. In this case, the heat sink 60 may be disposed in the first air guide portion 80a. Air having flown from the air blowing fan 70 to the air guide 80 flows toward the heat sink 60 and cools the heat sink 60 while passing through the first air guide portion 80a of the air guide 80.

The air guide 80 may further include a second air guide portion (guide) 80b which guides air such that the air is discharged in a vertical direction, for example, outward. The second air guide portion 80b may be bent in the upward-downward direction of the base bracket 50. The second air guide portion 80b may face a lower side of the electric range and change a flow direction of air having flown to the air guide 80.

That is, the upper wall 820 of the air guide 80 may be bent downward at the second air guide portion 80b, and guide air discharged from the second air guide portion 80b such that the air flows to the lower portion of the case 10. In the above-described structure, air discharged from the air blowing fan 70 flows into the air guide 80 in the frontward-rearward direction of the electric range, and flows from the air guide 80 in the downward direction of the electric range, as indicated by the arrows in FIG. 6.

The air guide 80 may further include a third air guide portion (guide) 80c and a fourth air guide portion (guide) 80d which are formed between the first air guide portion 80a and the second air guide portion 80b. The third air guide portion 80c may extend from the first air guide portion 80a, and change a flow direction of air having passed through the first air guide portion 80a. The first lateral wall 810 of the air guide 80 may be bent from an end portion of the first air guide portion 80a to have a slant, and form the third air guide portion 80c.

That is, the first lateral wall 810 forming the third air guide portion 80c may have a slant with respect to the frontward-rearward direction of the air guide 80 at an inlet of the third air guide portion 80c. With this structure, air may flow at a slant with respect to the frontward-rearward direction of the air guide 80, in the third air guide portion 80c.

As the third air guide portion 80c is formed as described above, when the air guide 80 is mounted onto the base bracket 50, elements disposed on the printed circuit board 51 and the first lateral wall 810 do not meet each other in a region where the base bracket overlaps the air guide 80 vertically. That is, the third air guide portion 80c may have a slanted structure to avoid the elements disposed on the printed circuit board 51.

The fourth air guide portion 80d may extend from the third air guide portion 80c, communicate with the second air guide portion 80b, and change a flow direction of air having passed through the third air guide portion 80c. The first lateral wall 810 of the air guide 80 may be bent from the end portion of the third air guide portion 80c to have a slant, and form the fourth air guide portion 80d.

That is, the first lateral wall 810 forming the fourth air guide portion 80d may have a slant with respect to the first lateral wall 810 of the third air guide portion 80c at an outlet of the third air guide portion 80c. With this structure of the fourth air guide portion 80d, a flow direction of air of the air guide 80 may change again to the frontward-rearward direction of the air guide 80.

Air having passed through the fourth air guide portion 80d may be discharged from a lower portion of the electric range through the second air guide portion 80b. Referring to FIG. 9, air having flown to an outlet of the fourth air guide portion 80d in the air guide 80 in the frontward-rearward direction of the electric range changes its flow direction in the second air guide portion 80b, and flows to the lower portion of the electric range through the outlet of the second air guide portion 80b and is discharged from the air guide 80.

The upper wall 820 of the air guide 80 may be bent downward in the second air guide portion 80b, and guide air discharged from the second air guide portion 80b such that the air flows to the lower portion of the case 10. That is, air may be discharged from the air guide 80 through the second air guide portion 80b in FIG. 9, and flow in the downward direction of the electric range, that is, flow to the lower portion of the case 10.

Figure 10:
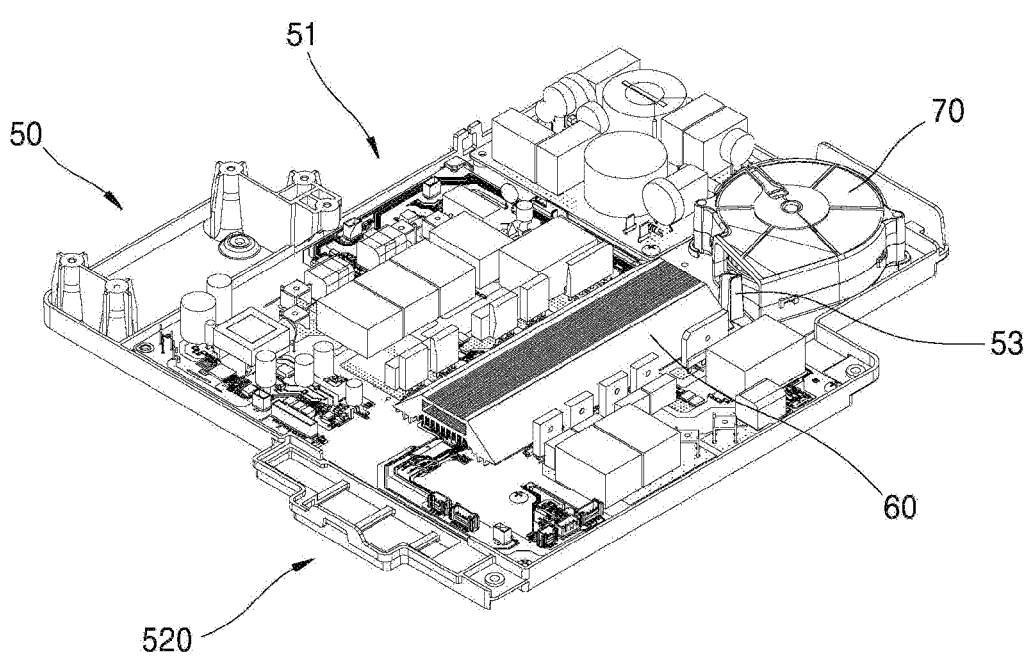
FIG. 10 is a perspective view showing a printed circuit board (PCB) mounted onto a base bracket according to an embodiment.
Figure 11:
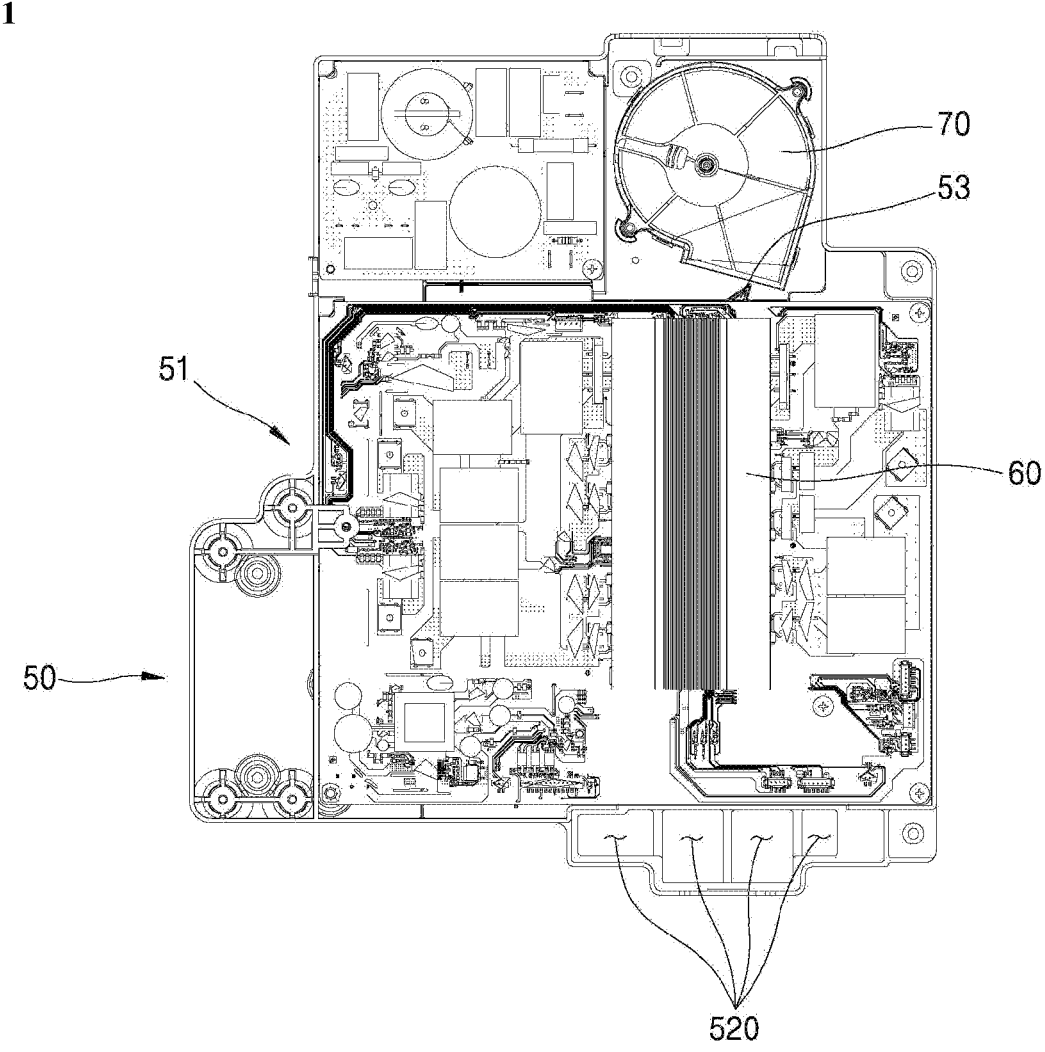
FIG. 11 is a plan view of the PCB mounted on the base bracket of FIG. 10.
Figure 12:
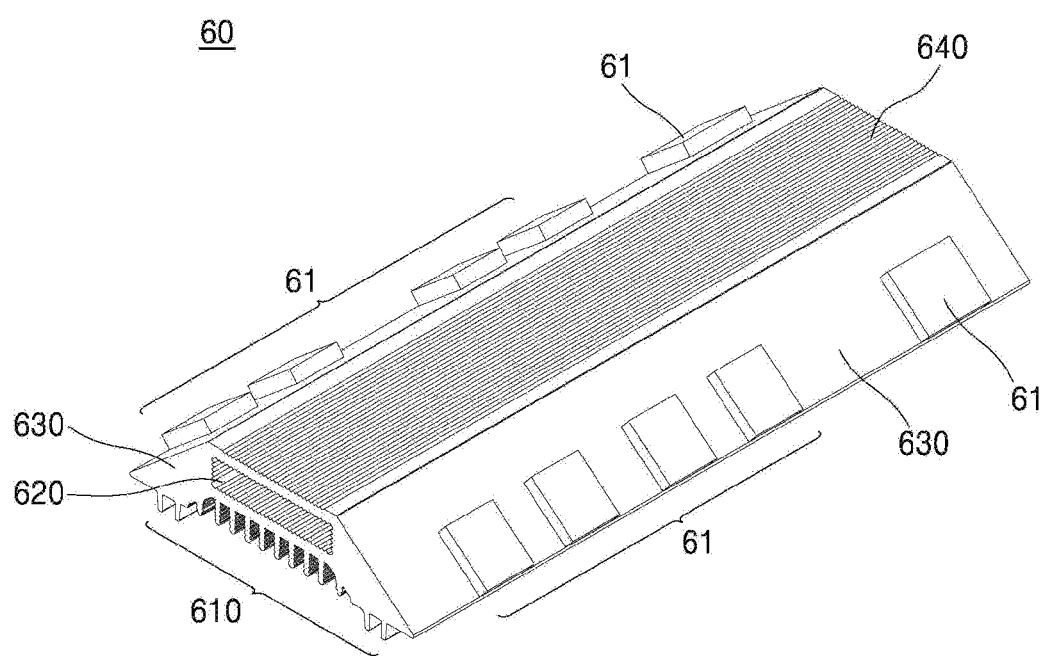
FIG. 12 is a perspective view of a heat sink according to an embodiment.
Figure 13:
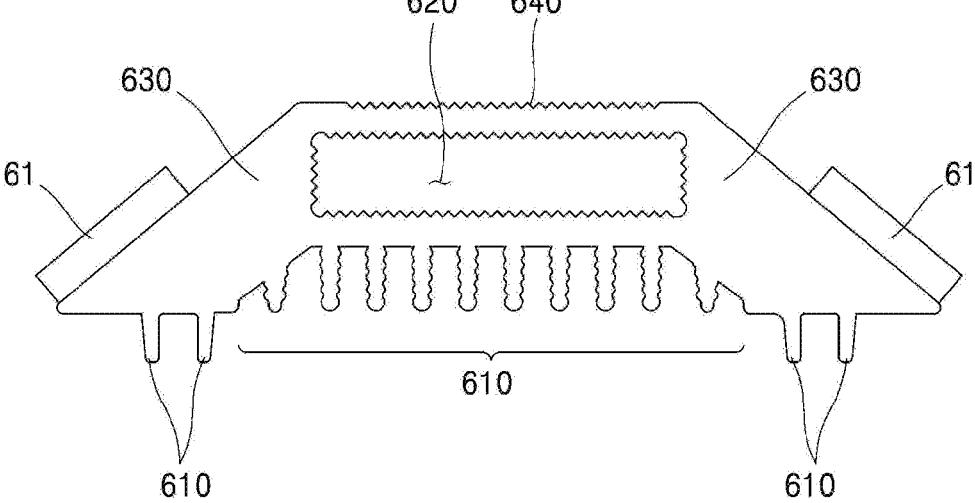
FIG. 13 is a front view of the heat sink according to an embodiment.

FIG. 10 is a perspective view of a printed circuit board (PCB) mounted onto a base bracket according to an embodiment. FIG. 11 is a plan view of the PCB mounted on the base bracket FIG. 10. FIG. 12 is a perspective view of a heat sink according to an embodiment. FIG. 13 is a front view of the heat sink according to an embodiment.

A lengthwise direction of the heat sink 60 may extend parallel with a flow direction of air passing through the air guide 80. With this structure, a contact surface area and time for contact between the heat sink 60 and air flow increases, thereby enhance cooling efficiency of the heat sink 60. To correspond to the above-described disposition structure of the heat sink 60, a lengthwise direction of the air guide 80 may also extend approximately in parallel with a flow direction of air.

As illustrated in FIGS. 12 and 13, the heat sink 60 may be provided with a plurality of cooling fins 610. The plurality of cooling fins 610 may protrude downward from a lower surface of the heat sink 60, and extend in a direction parallel with the lengthwise direction of the heat sink 60. The plurality of cooling fins 610 helps to increase a contact surface area between the heat sink 60 and air in the heat sink 60, thereby enhancing cooling efficiency of the heat sink 60.

Each of the plurality of cooling fins 610 may be spaced at proper or predetermined intervals on the lower surface of the heat sink 60 in a widthwise direction of the heat sink 60. In this case, the cooling fin 610 may be respectively formed in a slanted part or portion 630 and a plane part or portion 640 of the heat sink 60.

Additionally, the heat sink 60 may be provided with a flow channel 620 that passes through the heat sink 60 in the lengthwise direction thereof and forms a flow path of air. The flow channel 620 may extend in the lengthwise direction of the heat sink 60, and pass through the plane part 640 of the heat sink 60.

As mentioned with reference to the plurality of cooling fins 610, the flow channel 620 helps to increase a contact surface area between the heat sink 60 and air in the heat sink 60, thereby enhancing cooling efficiency of the heat sink 60. In this case, the flow channel 620 may have concave and convex portions on an inner surface thereof. The concave and convex portions help to increase a contact surface area between air and the heat sink 60, thereby enhancing cooling efficiency of the heat sink 60.

The heat sink 60 may include the slanted part 630 and the plane part 640. The slanted part 630 may be disposed on both sides of the heat sink 60 and have an upper surface that inclines. The plane part 640 may be formed at a center of the heat sink 60, have the flow channel 620, and have an upper surface which is flat.

Concave and convex portions may be formed on an upper surface of the plane part 640. The concave and convex portions may help to increase a contact surface area between air and the heat sink 60, thereby enhancing cooling efficiency of the heat sink 60.

All or some of the heat generating elements 61 included in the printed circuit board 51 may be mounted onto the upper surface of the slanted part 630. Accordingly, air blown by the air blowing fan 70 may cool the heat generating elements 61 mounted onto the slanted part 630 of the heat sink 60, and effectively suppress overheating of the printed circuit board 51.

The slanted part 630 may have a structure in which a thickness of the slanted part decreases toward an edge thereof. The structure of the slanted part 630 plays a similar role to the cooling fin 610, to effectively cool the heat generating elements 61 mounted onto the slanted part 630.

Figure 14:
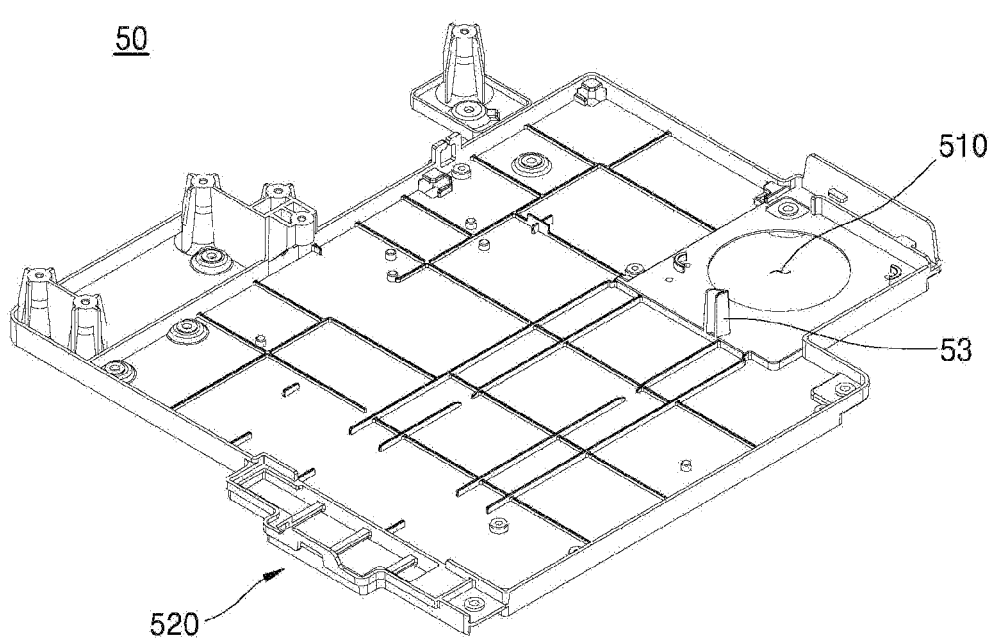
FIG. 14 is a perspective view of the base bracket according to an embodiment.
Figure 15:
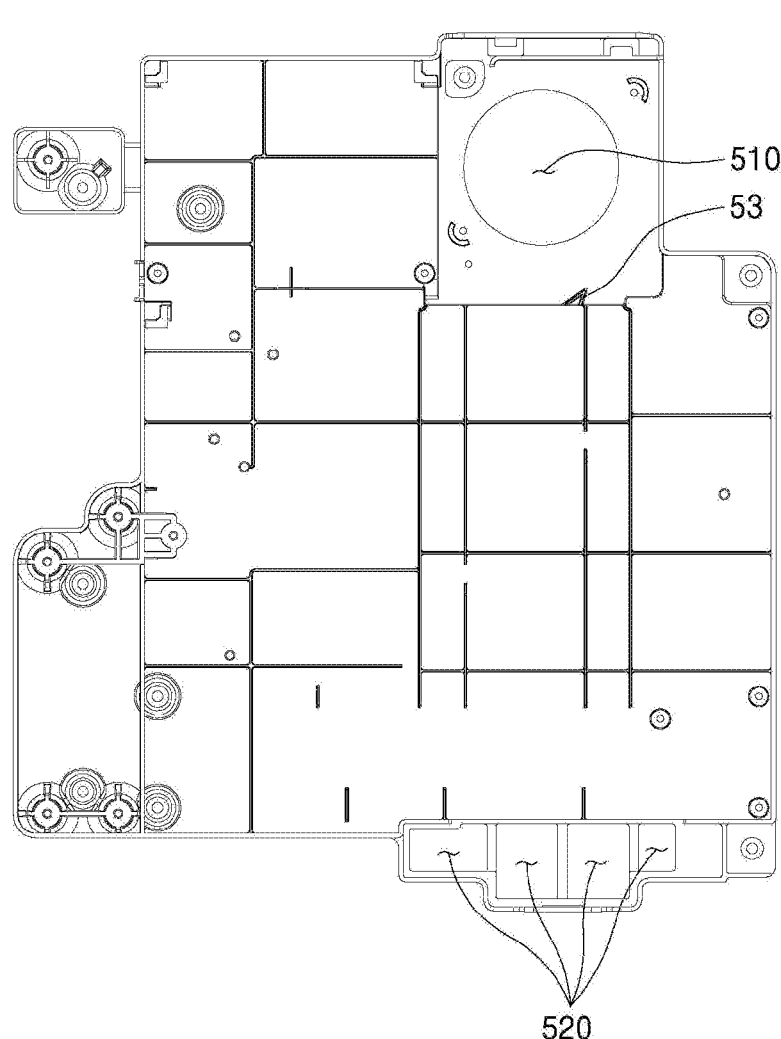
FIG. 15 is a plan view of the base bracket according to an embodiment.

FIG. 14 is a perspective view of the base bracket according to an embodiment. FIG. 15 is a plan view of the base bracket according to an embodiment.

The base bracket 50 may include a first vent part (vent) 510 that is formed in a portion corresponding to the air blowing fan 70, and a second vent part (vent) 520 that is formed in a portion corresponding to the fourth air guide portion 80d. In this case, the first vent part 510 may have a shape corresponding to a shape of the air blowing fan 70, and the second vent part 520 may have a shape corresponding to a shape of the fourth air guide portion 80d.

As the air blowing fan 70 operates, air moves upward from the first vent part 510 and flows into the air blowing fan 70, and as the flow direction of the air changes in the air blowing fan 70, flows in the frontward-rearward direction of the electric range, and passes through the air guide 80 and the heat sink 60. The flow direction of the air changes again at the outlet of the air guide 80, and the air flows to the lower side of the electric range, passes through the second vent part 520, and is discharged out of the air guide 80.

A pair of the slanted parts 630 may be provided for the heat sink 60, and the slanted part 630 may be respectively disposed in a position symmetrical to a center of the plane part 640. A heat generating element 61 that needs to be cooled may be disposed on each slanted part 630.

With this structure, heat generating elements 61 may be disposed in symmetrical positions on both sides of the heat sink 60. To evenly cool the heat generating element 61 disposed on both sides of the heat sink 60, air discharged from the outlet of the air blowing fan 70 needs to be guided such that the air flows to both sides of the heat sink 60 evenly.

For air to flow evenly to both sides of the heat sink 60, the electric range may be provided with a vane part (vane) 53. The vane part 53 may be disposed at a position where the air blowing fan 70 and the air guide 80 communicate with each other, and control a flow direction of air in the air guide 80, to allow the air to flow evenly to both sides of the heat sink 60.

For example, the vane part 53 may be formed at the base bracket 50. As another example, the vane part 53 may be integrated with the air guide 80, at the inlet of the air guide 80. Alternatively, the vane part 53 may be integrated with a housing of the air blowing fan 70, at the outlet of the air blowing fan 70.

Figure 16:
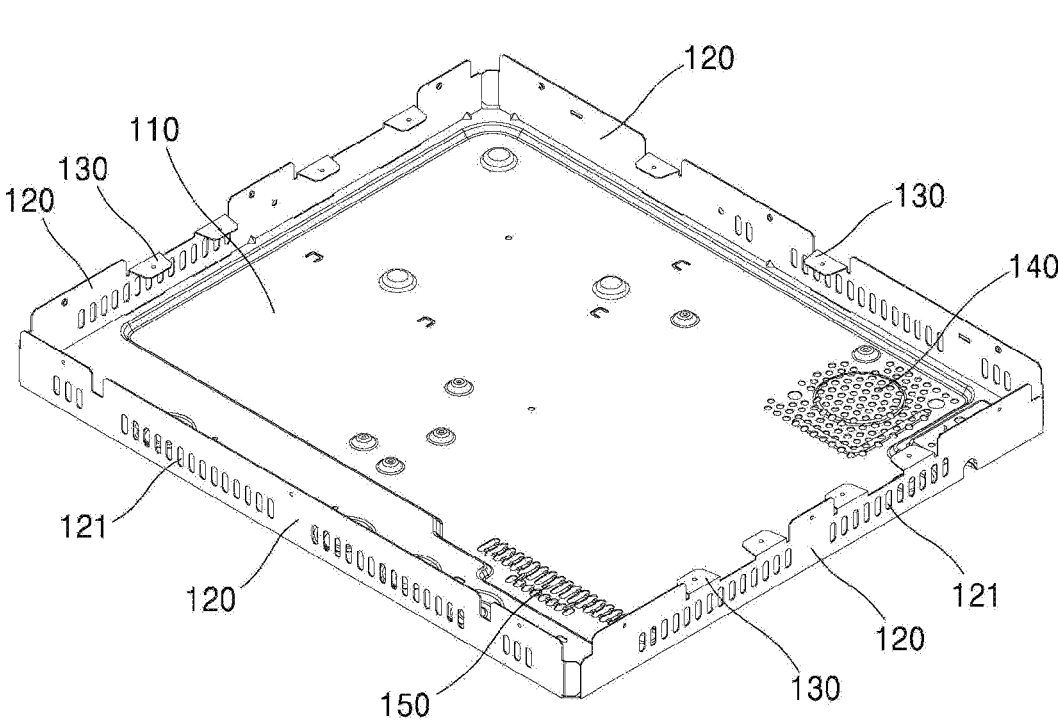
FIG. 16 is a perspective view of a case according to an embodiment.
Figure 17:
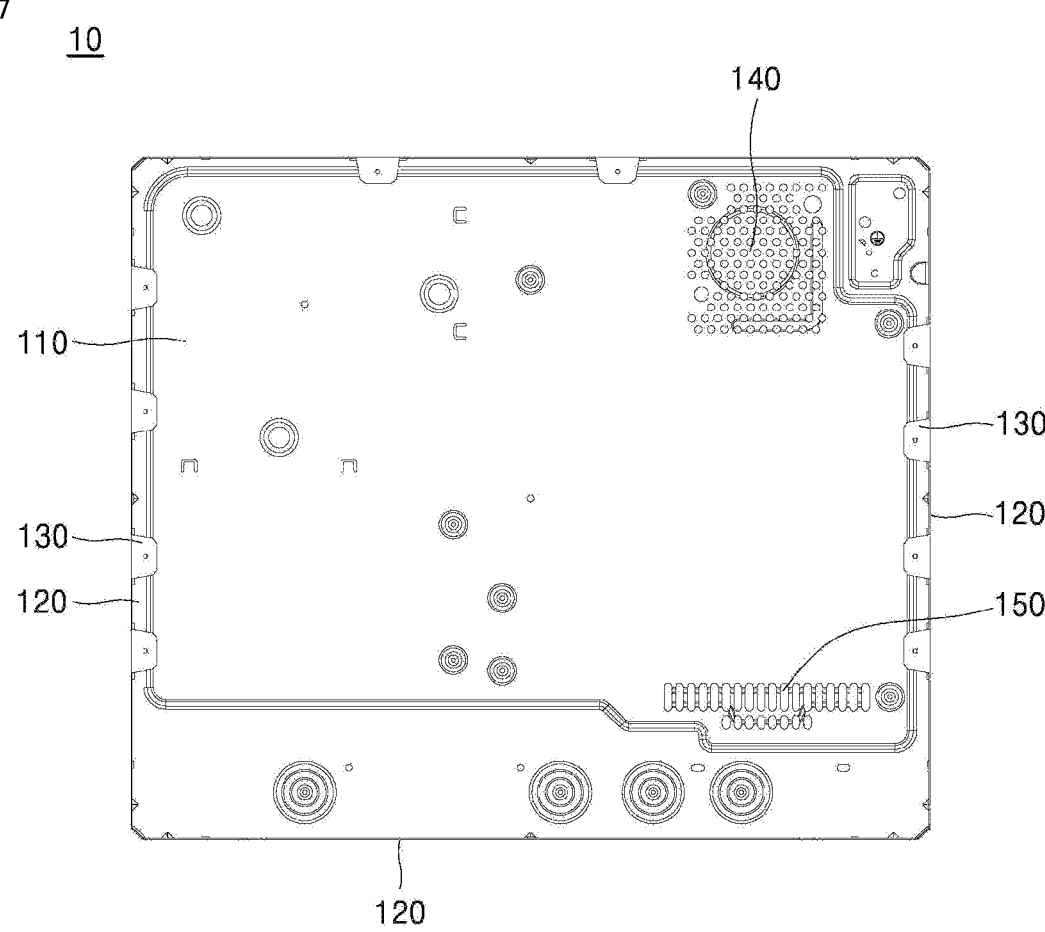
FIG. 17 is a plan view of the case according to an embodiment.

FIG. 16 is a perspective view showing a case according to an embodiment. FIG. 17 is a plan view of the case according to an embodiment. The case 10 may be provided with a first penetration hole 140 and a second penetration hole 150 to effectively introduce and discharge air blown by the air blowing fan 70.

The first penetration hole 140 may be formed in a portion corresponding to the first vent part 510, and the second penetration hole 150 may be formed in a portion corresponding to the second vent part 520. The first penetration hole 140 and the second penetration hole 150 may be formed in such a way that the first casing 110 forming the bottom surface of the case 10 is penetrated.

A plurality of the first penetration holes 140 and a plurality of the second penetration hole 150 may be provided. As the case 10 may be the outermost wall of the electric range, the plurality of first penetration holes 140 and the plurality of second penetration holes 150 may be holes having a relatively small surface area to suppress flow of foreign substances into the electric range through the plurality of first penetration holes 140 and the plurality of second penetration holes 150 formed at the case 10.

Figure 18:
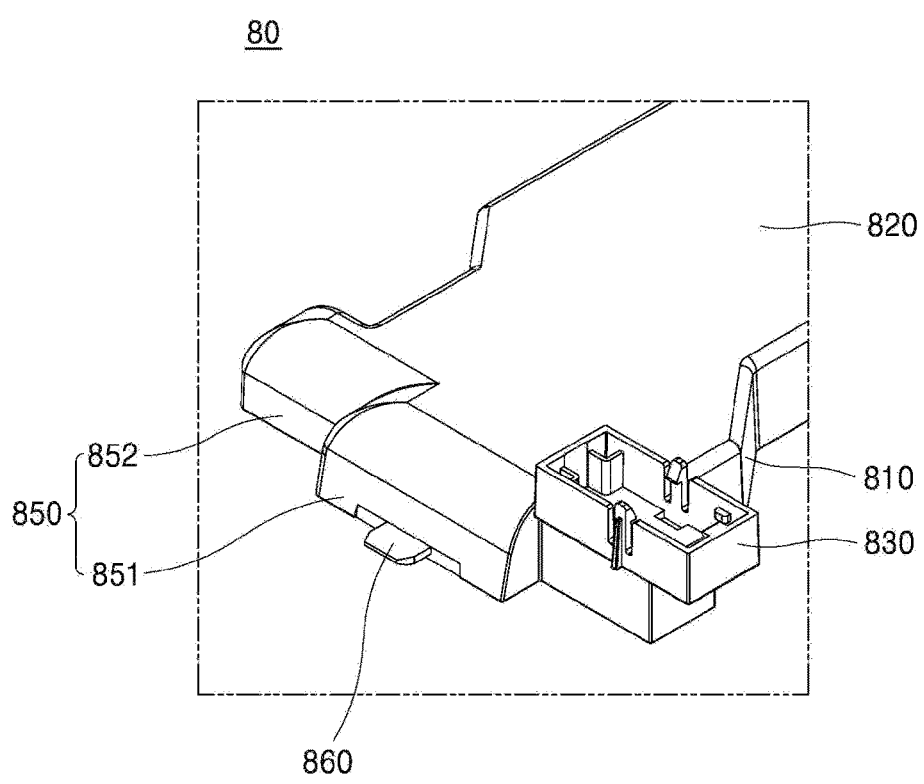
FIG. 18 is a partial enlarged view of the front portion of the air guide according to an embodiment.
Figure 19:
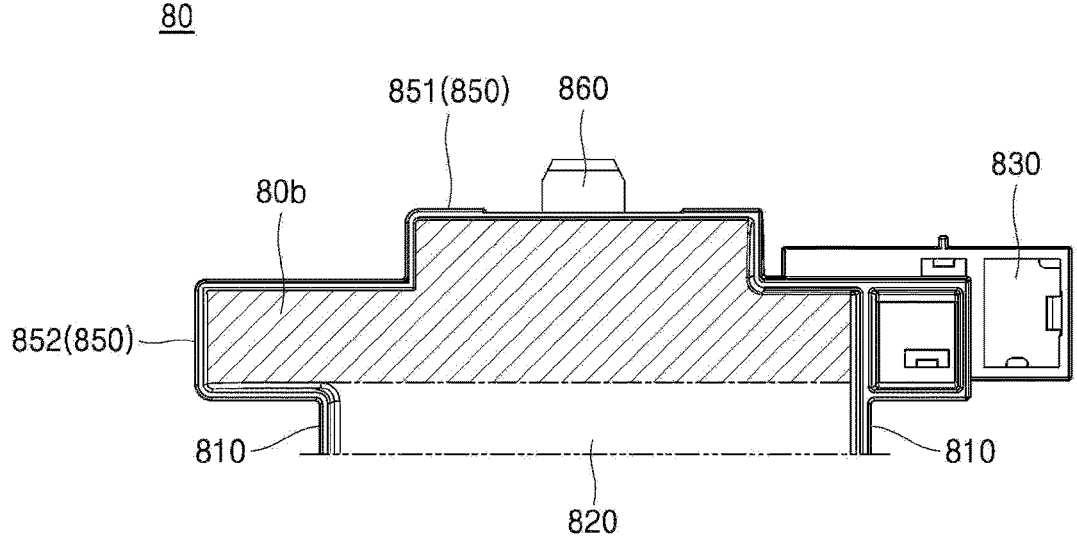
FIG. 19 is a bottom view of the air guide of FIG. 18.

FIG. 18 is a partial enlarged view showing a front portion of the air guide according to an embodiment. FIG. 19 is a bottom view of the air guide of FIG. 18.

As air flowing in the air flow space in the air guide 80 flows, the air may be heated by heat generated in the heat generating element 61. The heated air needs to be smoothly discharged out of the electric range through the outlet of the air guide 80.

If the heated air partially leaks into the electric range without being discharged out of the electric range along a determined flow path, at the outlet of the air guide 80, the leaked air may heat components, such as the printed circuit board 51, for example, disposed in the electric range, adversely affecting performance of the electric range. To prevent this from happening, the leakage of the heated air from the outlet of the air guide 80 into the electric range needs to be suppressed, to suppress the heating of the components in the electric range, caused by the heated air.

An electric range is provided having a structure in which leakage of heated air from the outlet of the air guide 80 into the electric range is effectively suppressed. The electric range may be provided with a sealing structure that can suppress leakage of heated air in the portion where the air guide 80 and the base bracket 50 are coupled, in a case in which the air guide 80 and the base bracket 50 are coupled. Hereinafter, description in relation to this is provided with reference to the drawings.

The air guide 80 may be detachably coupled to the base bracket 50, and provided with an expansion protrusion 850 and a first coupling projection 860. The expansion protrusion 850 may protrude from a portion of the air guide 80 where air is discharged outward from the air guide 80, and expand a cross section of the air guide 80. For example, the expansion protrusion 850 may expand the outlet of the air guide 80 to allow heated air to smoothly escape from the air guide 80.

The expansion protrusion 850 may expand the second air guide portion 80*b* if the second air guide portion 80*b* is formed as the outlet of the air guide 80, such that the cross section of the second air guide portion 80*b* becomes larger than that of the first air guide portion 80*a*. Accordingly, an increase of pressure may be suppressed even if air that is heated while flowing in the air guide 80 is expanded because of heating. As a result, inflow and discharge of air may occur smoothly in the air guide 80, as described above. In a case in which the air guide 80 does not has the second air guide portion 80*b*, the expansion protrusion 850 may expand the outlet of the first air guide portion 80*a*.

The expansion protrusion 850 may include a first protrusion 851, optionally together with a second protrusion 852. The first protrusion 851 may protrude in the lengthwise direction of the air guide 80, and be provided with the first coupling projection 860 that protrudes from the first protrusion 851. The first protrusion 851 may be provided to expand the cross section of the second air guide portion 80*b* if the second air guide portion 80*b* is formed as the outlet of the air guide 80. In a case in which the air guide 80 does not has the second air guide portion 80*b*, the first protrusion 851 may expand the outlet of the first air guide portion 80*a*.

The second protrusion 852 may protrude in a direction across the lengthwise direction of the air guide 80. The second protrusion 852 may be provided to expand the cross section of the second air guide portion 80*b* if the second air guide portion is formed as the outlet of the air guide 80. In a case in which the air guide 80 does not has the second air guide portion 80*b*, the second protrusion 852 may expand the outlet of the first air guide portion 80*a*.

The first coupling projection 860 may protrude from the expansion protrusion 850, and be coupled to the base bracket 50. The first coupling projection 860 may protrude from the first protrusion 851.

Figure 20:
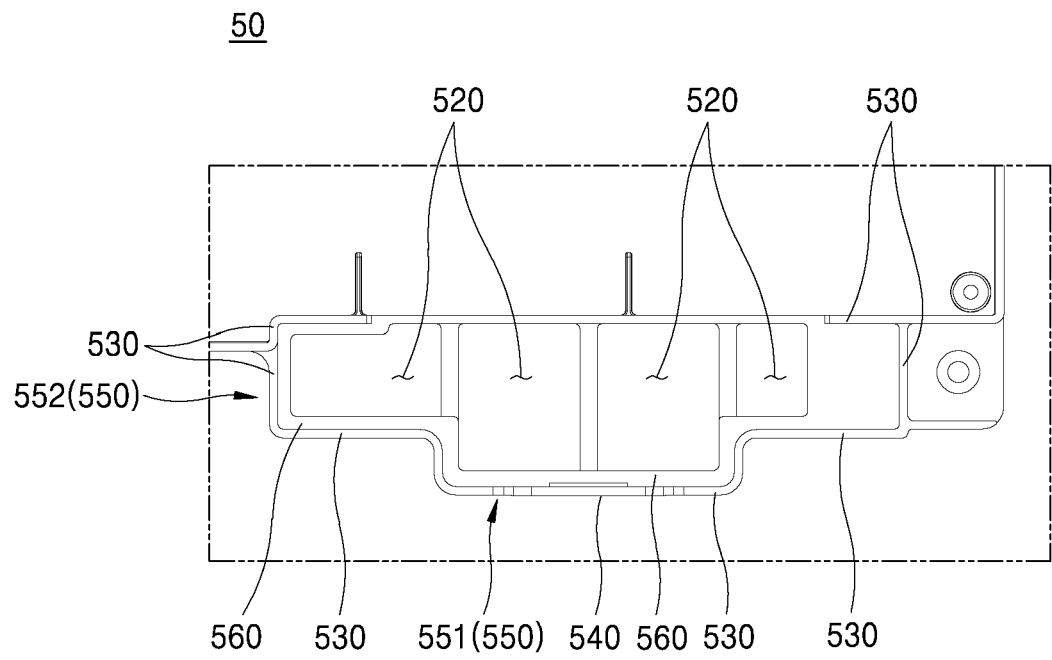
FIG. 20 is a plan view of a portion of the base bracket according to an embodiment, in which a second vent part is formed.
Figure 21:
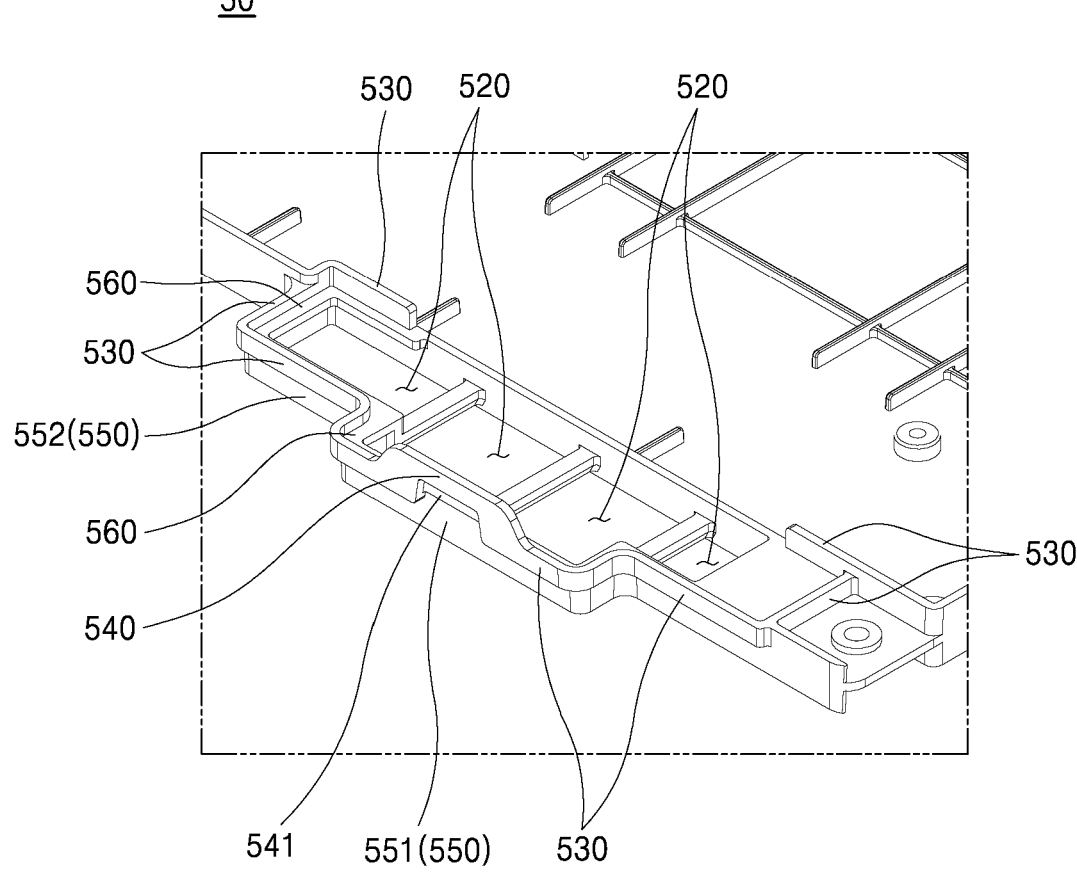
FIG. 21 is a perspective view of the base bracket FIG. 20.

FIG. 20 is a plan view showing a portion of the base bracket according to an embodiment, in which a second vent part is formed. FIG. 21 is a perspective view of the base bracket of FIG. 20.

The base bracket 50 may include an assembly protrusion 530 that protrudes in a shape corresponding to the shape of the expansion protrusion 850 and assembled to the expansion protrusion 850 to suppress of leakage of air. The base bracket 50 may include a second vent part (vent) 520 through which air discharged from the second air guide portion 80*b* of the air guide 80 passes. The second vent part 520 may have a shape vertically corresponding to the shape of the expansion protrusion 850 of the air guide 80, including the first protrusion 851 and the second protrusion 852. Accordingly, air may pass through the second air guide portion 80*b* and the second vent part 520 facing the expansion protrusion 850 of the air guide 80, and finally, pass through the second penetration hole 150 of the case 10 and be discharged from the lower portion of the electric range.

The assembly protrusion 530 may protrude upward from the base bracket 50 in such a way that the assembly protrusion 530 surrounds the second vent part 520. However, for the assembly protrusion 530 not to interfere with an air flow in the air guide 80, the assembly protrusion 530 may not be formed on a boundary between the second air guide portion 80*b* and the fourth air guide portion 80*d* of the air guide 80. Additionally, the assembly protrusion 530 may have a shape corresponding to the shape of the expansion protrusion 850, and as the base bracket 50 and the air guide

80 are coupled, the assembly protrusion 530 and the expansion protrusion 850 may be assembled to each other.

The base bracket 50 may include a base expansion part or portion 550 that has a shape corresponding to the shape of the expansion protrusion 850 and has the assembly protrusion 530 at an edge thereof. The base expansion part 550 has a shape corresponding to the shape of the expansion protrusion 850 in the upward-downward direction of the electric range, and has the second vent part 520.

The base expansion part 550 may include a first expansion part or portion 551 and a second expansion part or portion 552. The first expansion part 551 may protrude in the lengthwise direction of the air guide 80 to correspond to the shape of the first protrusion 851. The second expansion part 552 may protrude in a direction across the lengthwise direction of the air guide 80 to correspond to the shape of the second protrusion 852.

To suppress deformation of the base bracket 50 in the portion where the second vent part 520 is formed, a plurality of the second vent parts 520 may be provided, A frame that prevents deformation may be formed between the second vent parts 520.

Figure 22:
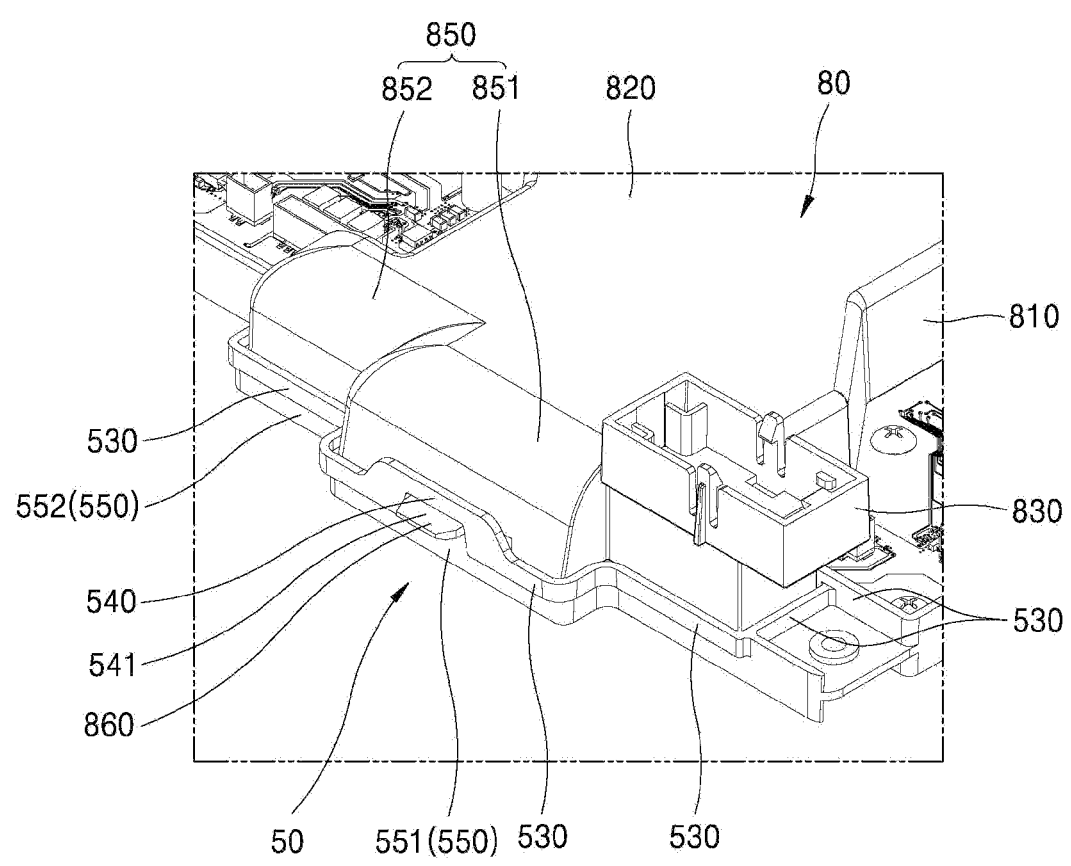
FIG. 22 is a perspective view showing an air guide coupled to the base bracket in FIG. 21.

FIG. 22 is a perspective view of an air guide coupled to the base bracket in FIG. 21. As the base bracket 50 and the air guide 80 are coupled to each other, a wall body of the expansion protrusion 850, forming the outlet of the air guide 80, may be disposed to contact an inside of the assembly protrusion 530. Further, a member that supports a lower portion of the communication substrate mounting part 830 may also be disposed to contact the inside the assembly protrusion 530.

As the base bracket 50 and the air guide 80 are coupled to each other, the assembly protrusion 530 protrudes from the base bracket 50 upward. Accordingly, a gap between the base bracket 50 and the air guide 80 may be sealed by the assembly protrusion 530. With this sealing structure, leakage of air flowing in the air guide 80 may be effectively suppressed in the gap between the base bracket 50 and the air guide 80.

The outlet of the air guide 80 has a shape corresponding to the shape of the second vent part 520 formed at the base bracket 50, and as the air guide 80 and the base bracket 50 are coupled and sealed by the assembly protrusion 530 at the outlet of the air guide 80, leakage of air, flowing in the flow space in the air guide 80, through the gap between the air guide 80 and the base bracket 50, may be effectively suppressed.

With this structure, heating of internal components, such as the printed circuit board 51, for example, caused by leakage of heated air through the gap in the portion where the air guide 80 and the base bracket 50 are coupled, may be suppressed, thereby effectively suppressing operation error and damage caused by overheating in the electric range.

Referring to FIGS. 21 and 22, the base bracket 50 may include a second coupling projection 540. The second coupling projection 540 may have a coupling through hole 541 which protrudes from the assembly protrusion 530 and to which the first coupling projection 860 is coupled.

The second coupling projection 540 may be integrated with the assembly protrusion 530, to couple the front portion of the air guide 80 to the base bracket 50. The second coupling projection 540 may protrude from the assembly protrusion 530 formed at the base expansion part 550. The second coupling projection 540 may have a coupling through hole 541, and as the first coupling projection 860 of the air guide 80 is fitted to the coupling through hole 541, the front portion of the air guide 80 may be coupled to the base bracket 50 easily and reliably.

The first coupling projection 860 may be readily fitted to or removed from the coupling through hole 541. With this structure, the front portion of the air guide 80 may be readily detached from the base bracket 50.

Figure 23:
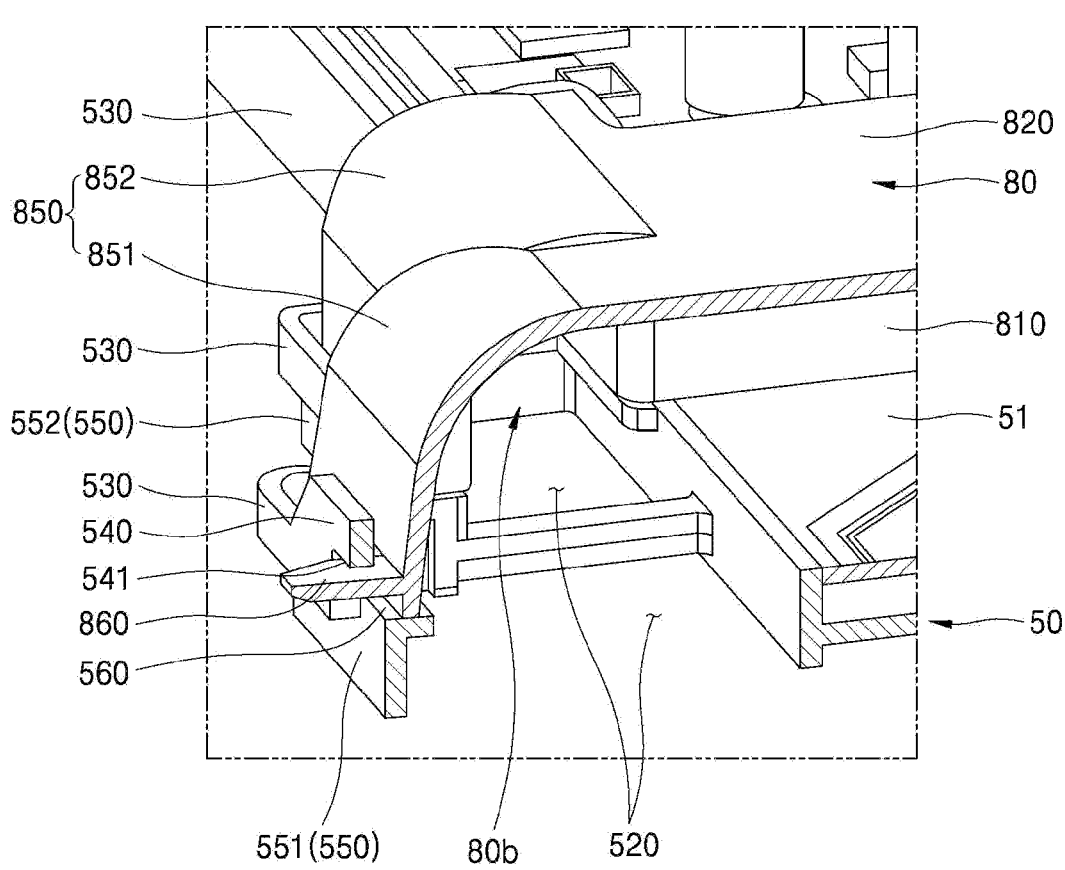
FIG. 23 is a perspective cross-sectional view showing a portion of FIG. 22 in an enlarged manner.
Figure 24:
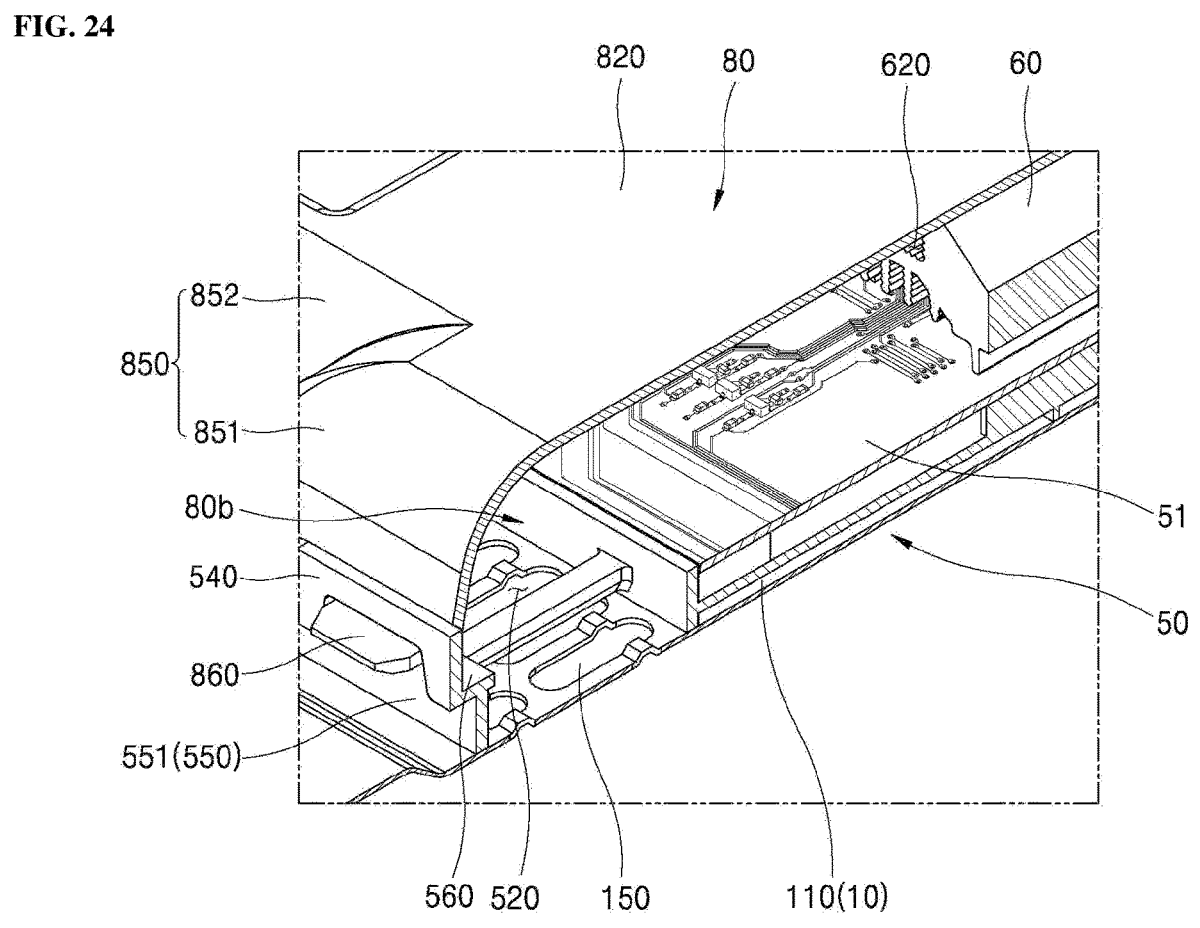

FIG. 23 is a perspective cross-sectional view showing a portion of FIG. 22 in an enlarged manner. FIG. 24 is a perspective cross-sectional view showing a portion of an air guide in an enlarged manner in a state in which a base bracket and a case 10 are coupled.

As illustrated in FIGS. 23 and 24, a step part (step) 560 may be formed in the portion where the base expansion part 550 and the assembly protrusion 530 connect to each other. As the assembly protrusion 530 protrudes further outward from the base bracket 50 than the base expansion part 550, the step part 560 may be formed.

For the lower end portion of the air guide 80, for example, the lower end portions of the first protrusion 851 and the second protrusion 852, to be readily mounted onto the assembly protrusion 530 and for the assembly protrusion 530 to effectively seal the gap between the base bracket 50 and the air guide 80, a structure that is contacted by the lower end portion of the air guide 80 and supports the air guide 80 is needed for the base bracket 50.

The base bracket 50 may have the step part 560 having the above structure. The lower end portion of the air guide 80, for example, the lower end portions of the first protrusion 851 and the second protrusion 852, is mounted onto the step part 560, and accordingly, the assembly protrusion 530 protruding from the step part 560 upward may effectively seal the gap between the base bracket 50 and the air guide 80.

As the step part 560 is provided, the cross section of the second air guide portion 80b of the air guide 80 may not decrease. Additionally, as the second air guide portion 80b does not decrease, an entire surface area of the second vent part 520 of the base bracket 50 and the second penetration hole 150 of the case 10 that are formed in the position corresponding to the second air guide portion 80b may not decrease. Accordingly, heated air may consecutively pass through exhaust portions of the air guide 80s, the base bracket 50s and the case 10 having a sufficient surface area, that is, the second air guide portion 80b, the second vent part 520, and the second penetration hole 150, and be smoothly discharged out of the electric range.

As the step part 560 supports the lower end portion of the air guide 80, the portions where heated air flowing in the air guide 80 is discharged outward, that is, the second air guide portion 80b, the second vent part 520, and the second penetration hole 150 may have a sufficient surface area, that is, a sufficient exhaust surface area. That is, the gap between the base bracket 50 and the air guide 80 may be effectively sealed while the exhaust surface area of the air guide 80 is maintained.

Referring to FIG. 24, as the air guide 80 is mounted onto the step part 560, the first coupling projection of the air guide 80 is fitted to the coupling through hole formed at the second coupling projection, and then the air guide 80 is coupled to the base bracket 50, the second air guide portion 80b of the air guide 80, the second vent part 520 of the base bracket 50, and the second penetration hole 150 of the case 10 may communicate in adjacent positions. In this case, the assembly protrusion 530 may seal the gap between the air guide 80 and the base bracket 50.

With this structure, as the leakage of heated air, discharged from the air guide, into the electric range through the gap between the air guide 80 and the base bracket 50 may be prevented or suppressed, and the heated air discharged out of the electric range smoothly, overheating of the components of the electric range, caused by the heated air, may be effectively suppressed.

In the present invention, the base bracket may comprise the first vent part that is formed in a portion corresponding to the air blowing fan where air enters the air guide, and a second vent part that is formed in a portion corresponding to the second air guide portion where air is vented from the air guide.

The case may comprise a plurality of first penetration holes being formed in a portion corresponding to the portion of the first vent part, and a plurality of second penetration holes being formed in a portion corresponding to the portion of the second vent part.

The inlet of the air guide may communicate with the outlet of the air blowing fan. The second air guide portion from which air is discharged from the air guide may communicate with the second vent part.

The case, base bracket, and the air guide may be combined with each other to form an air flow channel.

Air may sequentially pass through the plurality of first penetration holes, the first vent part, and the air blowing fan to enter the air guide. The air flowing the air guide may sequentially pass through the second air guide portion, the second vent part, and the plurality of second penetration holes to be discharged to the outside of the electric range.

The air guide may be detachably coupled to the base bracket, and provided with an expansion protrusion and a first coupling projection. The expansion protrusion may be formed to protrude from a portion of the air guide where air is discharged outward from the air guide, and expand a cross section of the air guide. For instance, the expansion protrusion may expand the outlet of the air guide to allow heated air to smoothly escape from the air guide. The first coupling projection may protrude from the expansion protrusion, and be coupled to the base bracket.

The base bracket may include an assembly protrusion that is formed to protrude in a shape corresponding to the shape of the expansion protrusion and assembled to the expansion protrusion to suppress of the leakage of air.

Embodiments disclosed herein provide an electric range that has a structure capable of effectively suppressing the leakage of heated air from an outlet of an air guide into the electric range. Embodiments disclosed herein further provide an electric range that has a sealing structure capable of suppressing the leakage of heated air at a place where an air guide and a base bracket are coupled to each other. Embodiments disclosed herein furthermore provide an electric range that has a structure in which an easily detachable air guide and a base bracket are coupled to each other.

Advantages are not limited to the above advantages, and other advantages that are not mentioned above can be clearly understood from the description and can be more clearly understood from the embodiments set forth herein. Additionally, advantages can be realized via means and combinations thereof that are described in the appended claims.

Embodiments disclosed herein provide an electric range which may include a case, a cover plate coupled to an upper side of the case and allowing an object to be placed thereon, a heating part or heater that heats the object, the heating part being disposed under the cover plate, an upper bracket disposed under the heating part and supporting the heating part, a base bracket disposed under the upper bracket and allowing a printed circuit board to be mounted thereon, a heat sink mounted onto the printed circuit board, an air blowing fan mounted onto the base bracket and discharging air toward the heat sink, and an air guide that communicates with the air blowing fan, surrounds the heat sink, and forms a flow path of air cooling the heat sink. The air guide may include a first air guide portion or guide that communicates with the air blowing fan and guides the air discharged from the air blow fan substantially horizontally. The air guide may further include an expansion protrusion that protrudes from the first air guide portion in a lengthwise direction of the air guide or in a direction across the lengthwise direction in the manner of expanding a cross section of the air guide. The air guide may further include a first coupling projection that protrudes from the expansion protrusion and coupled to the base bracket.

The air guide may include a first lateral wall and a second lateral wall. A flow space in which air flows may be formed by the first lateral wall and the second lateral wall.

A pair of first lateral walls may be provided, and the first lateral wall may be respectively disposed on both sides of the heat sink. An upper wall may be coupled to the upper end of the pair of first lateral walls to cover the heat sink.

The air guide may further include a second air guide portion or guide that communicates with the first air guide portion. The heat sink may be disposed in the first air guide portion. Air discharged from the air blowing fan to the air guide may flow to the heat sink and cool the heat sink while passing through the first air guide portion of the air guide.

The second air guide portion may bend in the upward-downward direction of the base bracket, and guide air such that the air is discharged in a vertical direction. The second air guide portion may be formed to face a lower side of the electric range and change a flow direction of air having flown along first air guide portion. That is, the upper wall of the air guide at the second air guide portion may bend downward, and guide air discharged from the second air guide portion such that the air flows to the lower portion of the case.

In the above-described structure, air discharged from the air blowing fan may flow into the air guide in the frontward-rearward direction of the electric range, and escape from the air guide in the downward direction of the electric range.

The air guide may further include a third air guide portion or guide and a fourth air guide portion or guide. The third air guide portion may extend from the first air guide portion, and change a flow direction of air having passed through the first air guide portion. The first lateral wall of the air guide forming the third air guide portion may bend from the end portion of the first air guide portion to have a slant.

That is, the first lateral wall may be formed to have a slant with respect to the frontward-rearward direction of the air guide in the third air guide portion of the air guide. With this structure, air may flow at a slant with respect to the front-ward-rearward direction of the air guide, in the third air guide portion.

The fourth air guide portion may extend from the third air guide portion, communicate with the second air guide portion, and change a flow direction of air having passed through the third air guide portion. The first lateral wall of the air guide forming the fourth air guide portion may bend from the end portion of the third air guide portion to have a slant.

That is, the first lateral wall may be formed to have a slant with respect to the first lateral wall of the third air guide portion at an outlet of the third air guide portion of the air guide. With this structure, a flow direction of air of the air guide may change again to the frontward-rearward direction of the air guide, in the fourth air guide portion.

A lengthwise direction of the heat sink may be in parallel with a direction in which air flows in the air guide. With this structure, a contact surface area and time for contact between the heat sink and air may increase, thereby enhance cooling efficiency of the heat sink. The lengthwise direction of the heat sink means a direction along which the heat sink has a longest length. This lengthwise direction of the heat sink may be the same direction as a lengthwise direction of the air guide.

The heat sink may include a plurality of cooling fins. The plurality of cooling fins may protrude downward from a lower surface of the heat sink, and extend in a direction parallel with the lengthwise direction of the heat sink.

The heat sink may be provided with a flow channel that passes through the heat sink in the lengthwise direction thereof to form a flow path of air. The flow channel may be formed in the lengthwise direction of the heat sink, and pass through a plane part or portion of the heat sink.

The heat sink may include a slanted part or portion and a plane part or portion. The slanted part may be disposed on both sides of the heat sink and have a slanted upper surface. The plane part may be formed at a center of the heat sink, have the flow channel, and have a flat upper surface.

All or some of the heat generating elements included in the printed circuit board may be mounted onto the upper surface of the slanted part. Accordingly, air blown by the air blowing fan may cool the heat generating elements mounted on the slanted part of the heat sink, and effectively suppress overheating of the printed circuit board.

The base bracket may include a first vent part or vent that is formed in a portion corresponding to the air blowing fan, and a second vent part or vent that is formed in a portion corresponding to the fourth air guide portion. In this case, the first vent part may have a shape corresponding to a shape of the air blowing fan, and the second vent part may have a shape corresponding to a shape of the fourth air guide portion.

The case may be provided with a first penetration hole and a second penetration hole to effectively introduce and discharge air blown by the air blowing fan. The first penetration hole may be formed in a portion corresponding to the first vent part, and the second penetration hole may be formed in a portion corresponding to the second vent part. The first penetration hole and the second penetration hole may be formed in such a way that the first casing forming the bottom surface of the case is penetrated.

The air guide may be detachably coupled to the base bracket, and provided with an expansion protrusion and a first coupling projection. The expansion protrusion may be formed to protrude from a portion of the air guide where air is discharged outward from the air guide, and expand a flow cross section of the air.

The expansion protrusion may include a first protrusion, optionally together with a second protrusion. The first protrusion may protrude in the lengthwise direction of the air guide, and be provided with the first coupling projection. The first protrusion may be provided to expand a cross section of the second air guide portion which is the outlet of the air guide in the lengthwise direction of the air guide.

The second protrusion may be formed to protrude in a direction across the lengthwise direction of the air guide. The second protrusion may be provided to expand the cross section of the second air guide portion which is the outlet of the air guide in the lateral direction of the air guide.

The first coupling projection may protrude from the expansion protrusion, and be coupled to the base bracket. The first coupling projection may protrude from the first protrusion.

The base bracket may include an assembly protrusion that is formed to protrude in a shape corresponding to a shape of the expansion protrusion and assembled to the expansion protrusion to suppress of leakage of air. The base bracket may include a second vent part or vent through which air discharged from the second air guide portion of the air guide passes. The second vent part may have a shape vertically corresponding to the shape of the expansion protrusion of the air guide, including the first protrusion and the second protrusion.

The base bracket may include a base expansion part or portion that has a shape corresponding to the shape of the expansion protrusion and has the assembly protrusion at an edge thereof. The base expansion part may have a shape corresponding to the shape of the expansion protrusion in the upward-downward direction of the electric range, and have a second vent part or vent.

As the base bracket and the air guide are coupled to each other, the wall body of the expansion protrusion, forming the outlet of the air guide, may be disposed to contact an inside of the assembly protrusion. Further, a member that supports the lower portion of a communication substrate mounting part or mount may also be disposed to contact the inside the assembly protrusion.

The base bracket may include a second coupling projection. The second coupling projection may have a coupling through hole to which the first coupling projection may be coupled.

The second coupling projection may be integrated with the assembly protrusion, to couple a front portion of the air guide to the base bracket. The second coupling projection may protrude from the assembly protrusion formed at the base expansion part.

Embodiments disclosed herein further provide an electric range which may include a case, a heating part or heater that heats an object, the heating part being disposed in the case, a base bracket disposed under the heating part and allowing a printed circuit board to be mounted thereon, a heat sink mounted onto the printed circuit board, an air blowing fan mounted onto the base bracket and discharging air toward the heat sink, and an air guide that communicates with the air blowing fan, surrounds the heat sink and forms a flow path of air cooling the heat sink. The air guide may include an expansion protrusion that protrudes from a position in which air is discharged outward, and expanding a cross section of the air guide, and a first coupling projection that protrudes from the expansion protrusion and being coupled to the base bracket. The base bracket may include an assembly protrusion protruding in a shape corresponding to a shape of the expansion protrusion, assembled to the expansion protrusion, and suppressing leakage of air.

According to embodiments disclosed herein, the outlet of the air guide has a shape corresponding to the second vent part formed at the base bracket, and as the air guide and the base bracket are sealed by the assembly protrusion and coupled at the outlet of the air guide, leakage of air, flowing in the flow space in the air guide, through a gap between the air guide and the base bracket may be suppressed effectively.

With this structure, the heating of inner components such as the printed circuit board and the like, caused by the leakage of heated air through the gap of the portion where the air guide and the base bracket are coupled, may be suppressed, thereby effectively suppressing operational errors and damage caused by the overheating inside the electric range.

According to another aspect of the present invention, the first coupling projection may be easily fitted to or detached from the coupling through hole. With this structure, the front portion of the air guide may be easily attached to and detached from the base bracket.

The embodiments are described above with reference to a number of illustrative embodiments thereof. However, embodiments are not limited to the embodiments and drawings set forth herein, and numerous other modifications and embodiments can be devised by one skilled in the art within the technical scope. Further, the effects and predictable effects based on the configurations in the disclosure are to be included within the range of the disclosure though not explicitly described in the description of the embodiments.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric range, comprising:
   a case;
   a cover plate coupled to an upper side of the case, and on which an object to be heated is placed;
   an air blowing fan discharging air;
   an air guide that communicates with the air blowing fan, and forms a flow path of air;
   a base bracket allowing a printed circuit board to be mounted thereon; and
   a heat sink being mounted onto the printed circuit board, wherein the heat sink is provided with a flow channel that passes through the heat sink in a lengthwise direction of the heat sink and forms a flow path of air.

2. The electric range of claim 1, wherein the air guide comprises:
   a first air guide that communicates with the air blowing fan and guides the air discharged from the air blow fan substantially horizontally; and
   an expansion protrusion that protrudes from the first air guide in a lengthwise direction of the air guide or in a direction perpendicular to the lengthwise direction of the air guide such that a cross section of the air guide expands, and wherein the base bracket comprises an assembly protrusion that protrudes in a shape corresponding to a shape of the expansion protrusion and is assembled to the expansion protrusion to suppress leakage of air.

3. The electric range of claim 2, wherein the expansion protrusion comprises:
   a first protrusion that protrudes in the lengthwise direction of the air guide, and including a first coupling projection; and
   a second protrusion that protrudes in a direction perpendicular to the lengthwise direction of the air guide.

4. The electric range of claim 3, wherein the base bracket comprises a second coupling projection that protrudes from the assembly protrusion and includes a coupling through hole to which the first coupling projection is coupled.

5. The electric range of claim 4, wherein the base bracket comprises a base expansion portion having a shape corresponding to a shape of the expansion protrusion and at an edge of which the assembly protrusion is provided.

6. The electric range of claim 5, wherein the air guide further comprises a second air guide that communicates with the first air guide, is bent in an upward-downward direction of the base bracket, and guides air such that the air is discharged in a vertical direction.

7. The electric range of claim 6, wherein the air guide further comprises:
   a pair of first lateral walls forming at least the first air guide; and
   an upper wall that forms at least the first air guide, is coupled to upper ends of the pair of first lateral walls.

8. The electric range of claim 7, wherein the air guide further comprises:
   a third air guide that extends from the first air guide and is bent from an end portion of the first air guide to change a flow direction of air having passed through the first air guide, wherein the third air guide is formed in such a way that a portion of the first lateral walls forming the third air guide includes a slant; and
   a fourth air guide that extends from the third air guide and is bent from an end portion of the third air guide, wherein the fourth air guide is formed in such a way that a portion of the first lateral walls forming the fourth air guide includes a slant.

9. The electric range of claim 7, wherein the air guide guides air discharged from the second air guide to a lower portion of the case as the upper wall is bent downward in the second air guide.

10. The electric range of claim 8, wherein the base bracket comprises:
    a first vent formed in a portion corresponding to the air blowing fan; and
    a second vent formed in a portion corresponding to the fourth air guide portion.

11. The electric range of claim 10, wherein the case comprises:
    a plurality of first penetration holes formed in a portion corresponding to the first vent; and
    a plurality of second penetration holes formed in a portion corresponding to the second vent.

12. The electric range of claim 2, wherein a lengthwise direction of the heat sink extends in parallel with a direction in which air flows in the air guide.

13. The electric range of claim 12, wherein the heat sink comprises a plurality of cooling fins that protrudes downward from a lower surface thereof and extends in a direction parallel with the lengthwise direction of the heat sink.

14. The electric range of claim 13, wherein the heat sink comprises:
    a slant disposed on both sides of the heat sink and having a slanted upper portion; and
    a plane formed at a center of the heat sink, having the flow channel, and having a flat upper surface.

15. An electric range, comprising:

a case;

a cover plate coupled to an upper side of the case, and on which an object to be heated is placed;

at least one heater that heats the object, the at least one heater being disposed under the cover plate;

an upper bracket that is disposed under the at least one heater and supports the at least one heater;

a base bracket that is disposed under the upper bracket and on which a printed circuit board is mounted;

a heat sink mounted on the printed circuit board;

an air blowing fan that is mounted on the base bracket and discharges air toward the heat sink; and an air guide that communicates with the air blowing fan, surrounds the heat sink, and forms a flow path of air cooling the heat sink, wherein a cross section of the air guide expands in a lengthwise direction of the air guide or in a direction perpendicular to the lengthwise direction of the air guide, and wherein the air guide includes a first coupling projection that protrudes from the air guide at an end opposite the air blowing fan and is coupled to the base bracket, and wherein the heat sink is provided with a flow channel that passes through the heat sink in a lengthwise direction of the heat sink and forms a flow path of air.

16. The electric range of claim 15, wherein at an end opposite the air blowing fan the air guide comprises:

a first protrusion that protrudes in the lengthwise direction of the air guide, and including the first coupling projection; and a second protrusion that protrudes in a direction perpendicular to the lengthwise direction of the air guide.

17. The electric range of claim 16, wherein the base bracket comprises a second coupling projection that protrudes therefrom and includes a coupling through hole to which the first coupling projection is coupled.

18. An electric range, comprising:

a case;

a cover plate coupled to an upper side of the case, and on which an object to be heated is placed;

at least one heater that heats the object, the at least one heater being disposed under the cover plate;

an upper bracket that is disposed under the at least one heater and supports the at least one heater;

a base bracket that is disposed under the upper bracket and on which a printed circuit board is mounted;

a heat sink mounted on the printed circuit board;

an air blowing fan that is mounted on the base bracket and discharges air toward the heat sink; and an air guide that communicates with the air blowing fan, surrounds the heat sink, and forms a flow path of air cooling the heat sink, wherein the air guide comprises:

a first air guide that communicates with the air blowing fan and guides the air discharged from the air blow fan substantially horizontally;

a second air guide that communicates with the first air guide, is bent in an upward-downward direction of the base bracket, and guides air such that the air is discharged in a vertical direction;

a third air guide that extends from the first air guide is bent from an end portion of the first air guide to change a flow direction of air having passed through the first air guide, wherein side walls of the third air guide are slanted with respect to a lengthwise direction of the air guide; and a fourth air guide that extends from the third air guide and is bent from an end portion of the third air guide, wherein a cross section of the air guide expands in the lengthwise direction of the air guide or in a direction perpendicular to the lengthwise direction of the air guide, wherein the air guide includes a first coupling projection that protrudes from the air guide at an end opposite the air blowing fan and is coupled to the base bracket, and wherein the heat sink is provided with a flow channel that passes through the heat sink in a lengthwise direction of the heat sink and forms a flow path of air.

19. The electric range of claim 18, wherein the second air guide comprises:

a first protrusion that protrudes in the lengthwise direction of the air guide, and including the first coupling projection; and a second protrusion that protrudes in a direction perpendicular to the lengthwise direction of the air guide.

* * * * *